US009018657B2

(12) United States Patent
Okabe et al.

(10) Patent No.: US 9,018,657 B2
(45) Date of Patent: Apr. 28, 2015

(54) SEMICONDUCTOR LIGHT EMITTING ELEMENT AND METHOD FOR PRODUCING SEMICONDUCTOR LIGHT EMITTING ELEMENT

(75) Inventors: Takehiko Okabe, Ichihara (JP); Kyosuke Masuya, Ichihara (JP); Takashi Hodota, Ichihara (JP)

(73) Assignee: Toyoda Gosei Co., Ltd., Aichi (JP)

( * ) Notice: Subject to any disclaimer, the term of this patent is extended or adjusted under 35 U.S.C. 154(b) by 62 days.

(21) Appl. No.: 13/258,959

(22) PCT Filed: Apr. 16, 2010

(86) PCT No.: PCT/JP2010/056834
§ 371 (c)(1),
(2), (4) Date: Sep. 22, 2011

(87) PCT Pub. No.: WO2010/125931
PCT Pub. Date: Nov. 4, 2010

(65) Prior Publication Data
US 2012/0012889 A1    Jan. 19, 2012

(30) Foreign Application Priority Data
Apr. 30, 2009 (JP) .................. 2009-111375

(51) Int. Cl.
*H01L 33/36* (2010.01)
*H01L 33/46* (2010.01)
*H01L 33/32* (2010.01)
(Continued)

(52) U.S. Cl.
CPC ............... *H01L 33/405* (2013.01); *H01L 33/32* (2013.01)

(58) Field of Classification Search
CPC ......... H01L 33/22; H01L 33/42; H01L 33/36; H01L 33/46
USPC ................. 257/330, 98; 438/29, 46
See application file for complete search history.

(56) References Cited

U.S. PATENT DOCUMENTS

| 7,417,264 B2 * | 8/2008 | Song et al. .................... 257/99 |
| 8,093,605 B2 * | 1/2012 | Kamei .............................. 257/98 |
| 2005/0133809 A1 | 6/2005 | Song et al. |

(Continued)

FOREIGN PATENT DOCUMENTS

| JP | 2005-184001 A | 7/2005 |
| JP | 2005-191572 A | 7/2005 |

(Continued)

*Primary Examiner* — Davienne Monbleau
*Assistant Examiner* — Damon Hillman
(74) *Attorney, Agent, or Firm* — Sughrue Mion, PLLC

(57) ABSTRACT

A semiconductor light emitting element (1) including of a substrate (110) composed of sapphire; a laminated semiconductor layer (100) composed of an n-type semiconductor layer (140), a light emitting layer (150) and a p-type semiconductor layer (160) provided on the substrate (110); a first electrode (170) formed in the p-type semiconductor layer (160); and a second electrode (180) formed in the n-type semiconductor layer (140). Further, the first electrode (170) includes a first conductive layer (171) composed of an oxide transparent conductive material laminated on the p-type semiconductor layer (160); a reflection layer (172) which contains silver laminated on the first conductive layer (171); a second conductive layer (173) composed of an oxide conductive material laminated on the reflection layer (172); and a coating layer (174) provided so as to cover the first conductive layer (171), the reflection layer (172) and the second conductive layer (173).

19 Claims, 10 Drawing Sheets

(51) Int. Cl.
*H01L 33/42* (2010.01)
*H01L 33/40* (2010.01)

(56) References Cited

U.S. PATENT DOCUMENTS

| | | |
|---|---|---|
| 2005/0139825 A1 | 6/2005 | Song et al. |
| 2006/0071226 A1* | 4/2006 | Kojima et al. .................. 257/98 |
| 2006/0231854 A1 | 10/2006 | Chae et al. |
| 2008/0145962 A1 | 6/2008 | Song et al. |
| 2008/0299687 A1 | 12/2008 | Song et al. |
| 2009/0008668 A1* | 1/2009 | Matsumura .................... 257/98 |
| 2009/0050916 A1* | 2/2009 | Katsuno et al. ................ 257/98 |

FOREIGN PATENT DOCUMENTS

| | | |
|---|---|---|
| JP | 2005-259971 A | 9/2005 |
| JP | 2006-108161 A1 | 4/2006 |
| JP | 2006-303430 A | 11/2006 |
| JP | 2007-027539 A | 2/2007 |
| JP | 2007-035735 A | 2/2007 |

* cited by examiner

SEMICONDUCTOR LIGHT EMITTING ELEMENT AND METHOD FOR PRODUCING SEMICONDUCTOR LIGHT EMITTING ELEMENT

TECHNICAL FIELD

The present invention relates to a semiconductor light emitting element using a group III nitride semiconductor and a method for producing the semiconductor light emitting element.

BACKGROUND ART

A semiconductor light emitting element using a group III nitride semiconductor such as GaN is usually configured by forming a group III nitride semiconductor layer including a light emitting layer on a substrate of, for example, sapphire. As such semiconductor light emitting elements, there are those which emit light outputted from the light emitting layer to the outside through the substrate by mounting the semiconductor light emitting element on a wiring board by flip-chip bonding.

As a conventional technique described in a gazette, there is a known technique for reflecting light, which has been outputted from a light emitting layer in an opposite direction of a substrate, toward the substrate by forming a transparent conductive layer composed of a metal oxide on a surface of a group III nitride semiconductor layer, whose surface is opposite to a contact surface with the substrate, and further forming a reflection layer composed of silver or the like on the transparent conductive layer (refer to Patent Literature 1).

Moreover, as another conventional technique described in a gazette, there is a known technique, in a semiconductor light emitting element including a positive electrode formed on a p-type semiconductor layer composed of a group III nitride semiconductor through a p-type contact layer, in which the positive electrode is configured with a first semiconductor film composed of an oxide, a metal film formed on the first semiconductor film and a second semiconductor film composed of an oxide and formed on the metal film (refer to Patent Literature 2).

CITATION LIST

Patent Literature

Patent Literature 1: Japanese Patent Application Laid-Open Publication No. 2006-303430

Patent Literature 2: Japanese Patent Application Laid-open Publication No. 2005-259971

SUMMARY OF INVENTION

Technical Problem

Incidentally, it is known that silver used in the reflection layer is a material that tends to cause migration. Therefore, in the case where, for example, a metal layer is formed on the reflection layer containing silver to protect thereof, a reflectance is reduced due to generation of roughness on an interface of the reflection layer caused by migration of silver, and as a result, there has been a possibility to lead the reduction in the light extraction efficiency.

An object of the present invention is to suppress the reduction in the light extraction efficiency in the semiconductor light emitting element mounted by flip-chip bonding.

Solution to Problem

In order to attain the object, in the present invention, there is provided a semiconductor light emitting element including: a group III nitride semiconductor layer including a light emitting layer that emits light by conduction; a transparent substrate that has optical permeability to the light emitted from the light emitting layer, on which the group III nitride semiconductor layer is laminated; a transparent conductive layer that is composed of a metal oxide having optical permeability to the light emitted from the light emitting layer and conductivity, the transparent conductive layer being laminated on the group III nitride semiconductor layer; a metal layer that is composed of any one of silver and an alloy containing silver and is laminated on the transparent conductive layer; a conductive layer that is composed of a metal oxide having conductivity and is laminated on the metal layer to be used for electrical connection with the outside; and a coating layer that is composed of a metal having conductivity, and is provided to cover the transparent conductive layer, the metal layer and the conductive layer, which are laminated, with respect to the group III nitride semiconductor layer.

Such a semiconductor light emitting element can be characterized in that the transparent conductive layer contains indium oxide as the metal oxide.

The semiconductor light emitting element can be further characterized in that the transparent conductive layer further contains zinc oxide as the metal oxide.

Moreover, the semiconductor light emitting element can be characterized in that the transparent substrate is composed of sapphire single crystals.

Further, the semiconductor light emitting element can be characterized in that the conductive layer is formed not to contact the group III nitride semiconductor layer.

Furthermore, the semiconductor light emitting element can be characterized in that the metal layer and the coating layer are arranged not to contact each other.

Still further, the semiconductor light emitting element can be characterized in that any one of the transparent conductive layer, the metal layer and the conductive layer includes a top surface that is formed along a surface of the group III nitride semiconductor layer and an inclined surface that is inclined to the group III nitride semiconductor layer from an edge portion of the top surface.

From another standpoint, in the present invention, there is provided a semiconductor light emitting element including: a substrate; a group III nitride semiconductor layer including a light emitting layer that emits light by conduction and is laminated on the substrate, the group III nitride semiconductor layer outputting the light emitted from the light emitting layer to the outside through the substrate; a transparent conductive layer that is composed of a metal oxide having optical permeability to the light emitted from the light emitting layer and conductivity, the transparent conductive layer being laminated on the group III nitride semiconductor layer on a side opposite to the substrate; a metal layer that is composed of any one of silver and an alloy containing silver and reflects the light incident from the light emitting layer through the transparent conductive layer; a conductive layer that is composed of a metal oxide having conductivity and is laminated on the metal layer to be used for electrical connection with the outside; and a coating layer that is composed of a metal having conductivity, and is provided to cover the transparent conductive layer, the metal layer and the conductive layer, which are laminated, with respect to the group III nitride semiconductor layer.

Such a semiconductor light emitting element can be characterized in that the transparent conductive layer contains indium oxide as the metal oxide.

The semiconductor light emitting element can be further characterized in that the transparent conductive layer further contains zinc oxide as the metal oxide.

Moreover, the semiconductor light emitting element can be characterized in that the substrate is composed of sapphire single crystals.

Further, the semiconductor light emitting element can be characterized in that the conductive layer is formed not to contact the group III nitride semiconductor layer.

Furthermore, the semiconductor light emitting element can be characterized in that the metal layer and the coating layer are arranged not to contact each other.

Still further, the semiconductor light emitting element can be characterized in that any one of the transparent conductive layer, the metal layer and the conductive layer includes a top surface that is formed along a surface of the group III nitride semiconductor layer and an inclined surface that is inclined to the group III nitride semiconductor layer from an edge portion of the top surface.

From further standpoint, in the present invention, there is provided a method for producing a semiconductor light emitting element including: forming a group III nitride semiconductor layer including a light emitting layer on a substrate; forming a first mask on the group III nitride semiconductor layer, the first mask having a first opening portion that extends from an inlet side thereof toward the group III nitride semiconductor layer to expose a partial region of the group III nitride semiconductor layer; forming a transparent conductive layer on the group III nitride semiconductor layer through the first opening portion, the transparent conductive layer being composed of a metal oxide having optical permeability to light emitted from the light emitting layer and conductivity; forming a metal layer on the transparent conductive layer through the first opening portion, the metal layer being composed of any one of silver and an alloy containing silver; forming a conductive layer on the metal layer through the first opening portion, the conductive layer being composed of a metal oxide having conductivity; removing the first mask from the group III nitride semiconductor layer; forming a second mask on the group III nitride semiconductor layer, the second mask having a second opening portion that extends from an inlet side thereof toward the group III nitride semiconductor layer to expose the conductive layer and the group III nitride semiconductor layer positioned on an edge of the conductive layer; forming a coating layer on the conductive layer and the group III nitride semiconductor layer through the second opening portion, the coating layer being composed of a metal having conductivity; and removing the second mask.

Such a method for producing a semiconductor light emitting element can be characterized in that a diameter of the second opening portion of the second mask on the inlet side thereof is set larger than a diameter of the first opening portion of the first mask on the inlet side thereof.

Advantageous Effects of Invention

According to the present invention, it is possible to suppress the reduction in the light extraction efficiency in the semiconductor light emitting element mounted by flip-chip bonding.

DESCRIPTION OF EMBODIMENTS

An exemplary embodiment of the present invention will be described in detail below with reference to the accompanying drawings.

Figure 1:
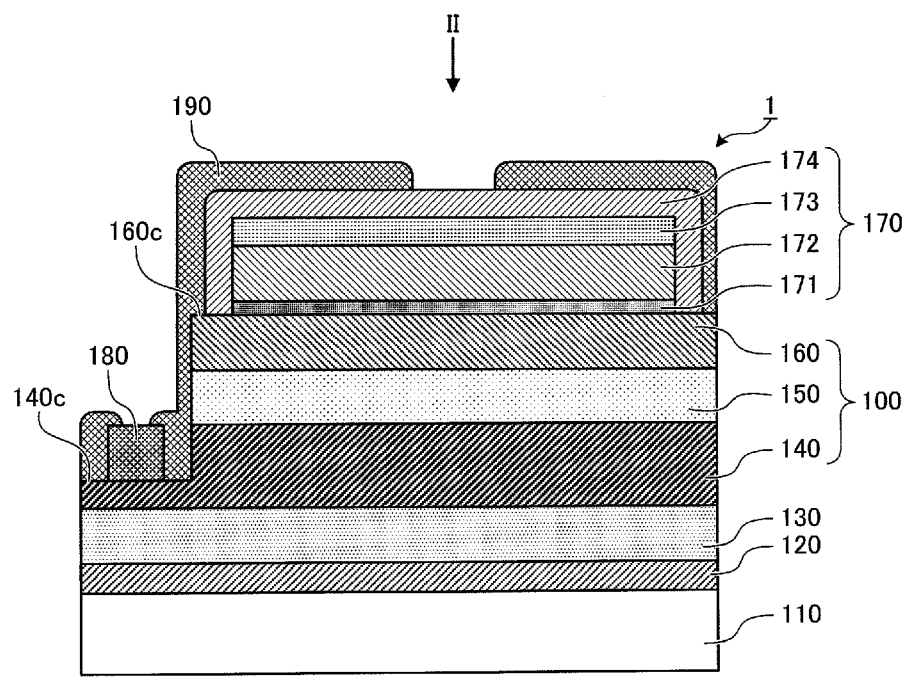
FIG. 1 is an example of a schematic cross-sectional view of a semiconductor light emitting element.
Figure 2:
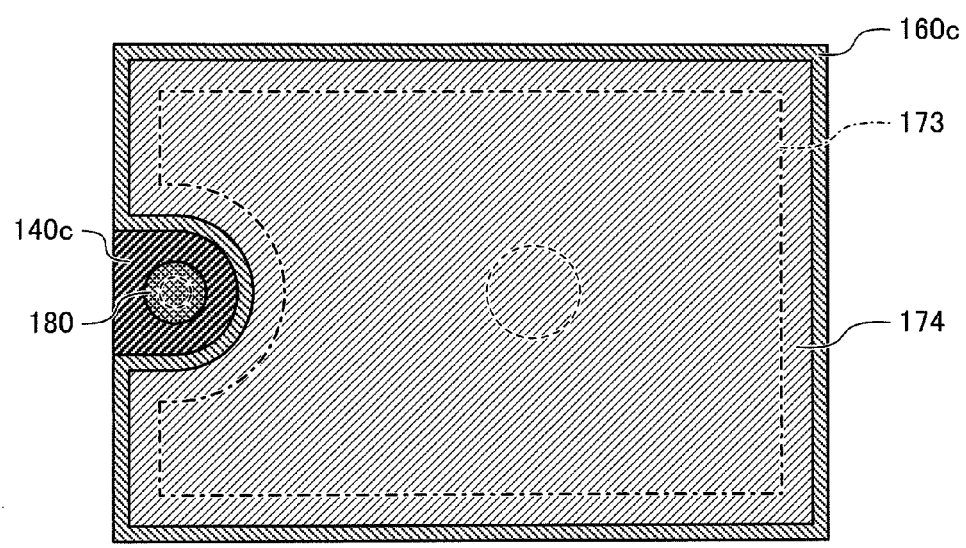
FIG. 2 is an example of a schematic plan view of the semiconductor light emitting element.
Figure 3:
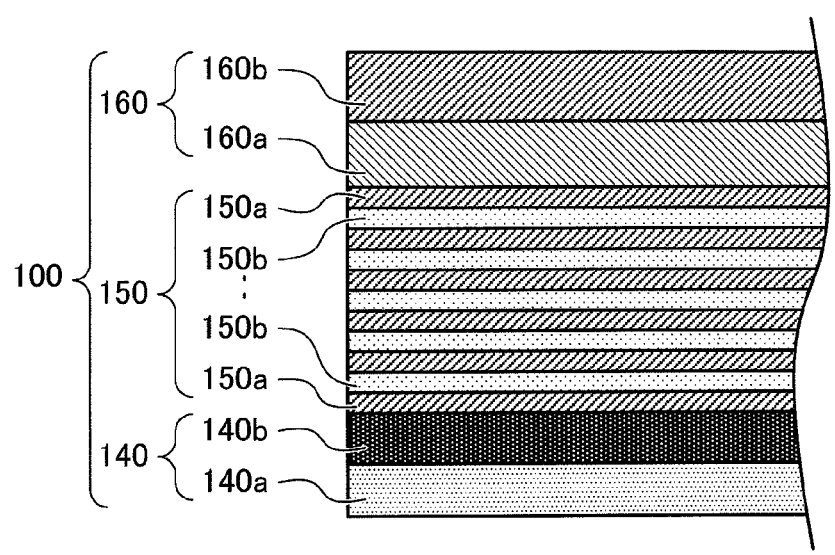
FIG. 3 is an example of a schematic cross-sectional view of a laminated semiconductor layer that constitutes the semiconductor light emitting element.

FIG. 1 shows an example of a schematic cross-sectional view of a semiconductor light emitting element (light emitting diode) 1 to which the exemplary embodiment is applied, FIG. 2 shows an example of a schematic plan view of the semiconductor light emitting element 1 shown in FIG. 1 as viewed from direction II shown in FIG. 1, and FIG. 3 shows an example of a schematic cross-sectional view of a laminated semiconductor layer that constitutes the semiconductor light emitting element.

(Semiconductor Light Emitting Element)

As shown in FIG. 1, the semiconductor light emitting element 1 includes: a substrate 110 as an example of a transparent substrate; an intermediate layer 120 laminated on the substrate 110; and a base layer 130 laminated on the intermediate layer 120. The semiconductor light emitting element 1 also includes: an n-type semiconductor layer 140 laminated on the base layer 130; a light emitting layer 150 laminated on the n-type semiconductor layer 140; and a p-type semiconductor layer 160 laminated on the light emitting layer 150. It should be noted that, in the following description, these n-type semiconductor layer 140, light emitting layer 150 and p-type semiconductor layer 160 are collectively referred to as a laminated semiconductor layer 100 as necessary.

The semiconductor light emitting element 1 further includes: a first electrode 170 formed on a top surface 160c of the p-type semiconductor layer 160; and a second electrode 180 formed on a semiconductor layer exposure surface 140c of the n-type semiconductor layer 140, which is exposed by cutting out a part of the laminated p-type semiconductor layer 160, light emitting layer 150 and n-type semiconductor layer 140. Still further, the semiconductor light emitting element 1 includes a protection layer 190 laminated on the first electrode 170 and the second electrode 180. However, the protection layer 190 is formed to expose a part of a surface in each of the first electrode 170 and the second electrode 180 positioned on an upper side as shown in FIG. 1.

In this manner, the semiconductor light emitting element 1 according to the exemplary embodiment has a structure in which the first electrode 170 and the second electrode 180 are formed on one surface side thereof.

It should be noted that the illustration of the protection layer 190 is omitted in FIG. 2, and in the first electrode 170 (more specifically, a coating layer 174 described in detail later) and the second electrode 180, the region not covered with the protection layer 190 is indicated by enclosing thereof with a broken line. Further, in FIG. 2, a second conductive layer 173 (details will be described later) provided on a back surface of the coating layer 174 is indicated by an alternate long and short dashed line.

In this semiconductor light emitting element 1, the light emitting layer 150 is configured to emit light by setting the first electrode 170 and the second electrode 180 as a positive electrode and a negative electrode, respectively, and via both of them, passing a current through the laminated semiconductor layer 100 as an example of a group III nitride semiconductor layer (more specifically, the p-type semiconductor layer 160, the light emitting layer 150 and the n-type semiconductor layer 140).

Next, each constituent of the semiconductor light emitting element 1 will be described in more detail.

<Substrate>

As the substrate 110, there is no particular limitation on any substrate as long as group III nitride semiconductor crystals are epitaxially grown on a surface thereof, and accordingly, various kinds of substrate can be selected and used. However, as will be described later, since the semiconductor light emitting element 1 of the exemplary embodiment is mounted by flip-chip bonding so that the light is extracted from the substrate 110 side, it is preferable to have optical permeability to the light emitted from the light emitting layer 150. Accordingly, the substrate 110 composed of, for example, sapphire, zinc oxide, magnesium oxide, zirconium oxide, magnesium-aluminum oxide, gallium oxide, indium oxide, lithium-gallium oxide, lithium-aluminum oxide, neodium-gallium oxide, lanthanum-strontium-aluminum-tantalum oxide, strontium-titanium oxide, titanium oxide and the like can be used.

Moreover, among the above-described materials, it is preferable to use sapphire whose chamfer is a principal surface as the substrate 110. In the case where sapphire is used as the substrate 110, the intermediate layer 120 (buffer layer) may be formed on the chamfer of sapphire.

<Laminated Semiconductor Layer>

The laminated semiconductor layer 100 is composed of, for example, the group III nitride semiconductor, which is configured by laminating the n-type semiconductor layer 140, the light emitting layer 150 and the p-type semiconductor layer 160 on the substrate 110 in this order as shown in FIG. 1.

Further, as shown in FIG. 3, each of the n-type semiconductor layer 140, the light emitting layer 150 and the p-type semiconductor layer 160 may be configured by plural semiconductor layers. Moreover, the laminated semiconductor layer 100 may further include the base layer 130 and the intermediate layer 120. Here, the n-type semiconductor layer 140 performs electrical conduction of a first conduction type in which an electron is a carrier, while the p-type semiconductor layer 160 performs electrical conduction of a second conduction type in which a hole is a carrier.

It should be noted that the laminated semiconductor layer 100 with excellent crystallinity can be obtained by forming by an MOCVD method, however, a sputtering method under optimized conditions can form a semiconductor layer having more excellent crystallinity than that formed by the MOCVD method. Hereinafter, descriptions will be sequentially given.

<Intermediate Layer>

The intermediate layer 120 is preferably composed of polycrystal $Al_xGa_{1-x}N$ ($0 \leq x \leq 1$), and more preferably, composed of single crystal $Al_xGa_{1-x}N$ ($0 \leq x \leq 1$).

As described above, the intermediate layer 120 can be, for example, composed of polycrystal $Al_xGa_{1-x}N$ ($0 \leq x \leq 1$) with a thickness of 0.01 μm to 0.5 μm. If the thickness of the intermediate layer 120 is less than 0.01 μm, there are some cases where an effect of the intermediate layer 120 to mediate the difference in lattice constant between the substrate 110 and the base layer 130 cannot be sufficiently obtained. On the other hand, if the thickness of the intermediate layer 120 is more than 0.5 μm, there is a possibility that the time of forming process of the intermediate layer 120 becomes longer though there is no change to the function of the intermediate layer 120, and accordingly the productivity is decreased.

The intermediate layer 120 has a function of mediating the difference in lattice constant between the substrate 110 and the base layer 130 to facilitate the formation of a single crystal layer which is c-axis oriented on the (0001) surface (chamfer) of the substrate 110. Consequently, if a single crystal base layer 130 is laminated on the intermediate layer 120, the base layer 130 having more excellent crystallinity can be laminated. It should be noted that the intermediate layer forming process is preferably carried out in the present invention, but not necessarily needed.

Further, the intermediate layer 120 may have a crystal structure of a hexagonal system composed of a group III nitride semiconductor. Moreover, the crystal of the group III nitride semiconductor constituting the intermediate layer 120 may have a single crystal structure, and those having a single crystal structure are preferably used. Crystals of the group III nitride semiconductor grow not only in an upper direction but also in an in-plane direction to form a single crystal structure by controlling growing conditions. Accordingly, the intermediate layer 120 can be composed of the group III nitride semiconductor crystals having single crystal structure by controlling layer forming conditions thereof. In the case where the intermediate layer 120 having such a single crystal structure is formed on the substrate 110, the buffer function of the intermediate layer 120 effectively works, and thereby the group III nitride semiconductor formed thereon becomes a crystal film having excellent orientation property and crystallinity.

Furthermore, it is possible to provide the group III nitride semiconductor crystals constituting the intermediate layer 120 as columnar crystals (polycrystals) composed of a texture based on hexagonal columns by controlling layer forming conditions. It should be noted that the columnar crystals composed of a texture described here refers to crystals which are separated from adjacent crystal grains by crystal grain boundaries formed therebetween, and are columnar by themselves in a longitudinal sectional shape.

<Base Layer>

As the base layer 130, $Al_xGa_yIn_zN$ ($0 \leq x \leq 1$, $0 \leq y \leq 1$, $0 \leq z \leq 1$, $x+y+z=1$) can be used, but it is preferable to use $Al_xGa_{1-x}N$ ($0 \leq x < 1$) because the base layer 130 with excellent crystallinity can be formed.

The thickness of the base layer 130 is preferably 0.1 μm or more, more preferably 0.5 μm or more, and most preferably 1 μm or more. The $Al_xGa_{1-x}N$ layer having excellent crystallinity is likely to be obtained with these layer thickness or more.

To improve the crystallinity of the base layer 130, it is desirable that the base layer 130 is not doped with impurities.

However, if conductivity of p-type or n-type is needed, acceptor impurities or donor impurities can be added.

<N-Type Semiconductor Layer>

As shown in FIG. 3, the n-type semiconductor layer 140 as an example of the first semiconductor layer is preferably configured with an n-contact layer 140a and an n-cladding layer 140b. It should be noted that the n-contact layer 140a can also serve as the n-cladding layer 140b. Further, the above-described base layer 130 may be included in the n-type semiconductor layer 140.

The n-contact layer 140a is a layer for providing the second electrode 180. The n-contact layer 140a is preferably configured with the $Al_xGa_{1-x}N$ layer ($0 \leq x < 1$, more preferably $0 \leq x \leq 0.5$, and still more preferably $0 \leq x \leq 0.1$).

Further, the n-contact layer 140a is preferably doped with n-type impurities, and preferably contains the n-type impurities having a density of $1 \times 10^{17}/cm^3$ to $1 \times 10^{20}/cm^3$, and preferably a density of $1 \times 10^{18}/cm^3$ to $1 \times 10^{19}/cm^3$ on the point that a good ohmic contact with the second electrode 180 can be maintained. The n-type impurities are not particularly limited, however, Si, Ge, Sn and so on are provided, and Si and Ge are preferably provided.

The thickness of the n-contact layer 140a is preferably set to 0.5 μm to 5 μm, and more preferably set in a range of 1 μm to 3 μm. If the layer thickness of the n-contact layer 140a is in the above-described ranges, crystallinity of the semiconductor is suitably maintained.

It is preferable to provide the n-cladding layer 140b between the n-contact layer 140a and the light emitting layer 150. The n-cladding layer 140b performs injection of the carriers into the light emitting layer 150 and confinement of the carriers. The n-cladding layer 140b can be formed of AlGaN, GaN, GaInN and so on. The hetero junction structure or the superlattice structure in which the layer is laminated plural times of these structures may also be used. When the n-cladding layer 140b is formed of GaInN, the band gap thereof is preferably larger than that of GaInN of the light emitting layer 150.

The thickness of the n-cladding layer 140b is not particularly limited, but preferably in a range of 0.005 μm to 0.5 μm, and more preferably in a range of 0.005 μm to 0.1 μm. The doping concentration of the n-cladding layer 140b is preferably in a range of $1 \times 10^{17}/cm^3$ to $1 \times 10^{20}/cm^3$, and more preferably in a range of $1 \times 10^{18}/cm^3$ to $1 \times 10^{19}/cm^3$. It is preferable to provide the doping concentration in these ranges in terms of maintaining excellent crystallinity and reducing operation voltage of the light emitting element.

It should be noted that, in the case where the n-cladding layer 140b is a layer containing the superlattice structure, the layer may contain a structure in which an n-side first layer composed of the group III nitride semiconductor with a thickness of 100 angstroms or less and an n-side second layer having a different composition from the n-side first layer and composed of the group III nitride semiconductor with a thickness of 100 angstroms or less are laminated, though detailed illustration is omitted.

Further, the n-cladding layer 140b may contain a structure in which the n-side first layers and the n-side second layers are alternately and repeatedly laminated, and the structure is preferably an alternating structure of GaInN and GaN or an alternating structure of GaInN having different compositions.

<Light Emitting Layer>

As the light emitting layer 150 laminated on the n-type semiconductor layer 140, a single quantum well structure or a multiple quantum well structure can be employed.

As a well layer 150b having a quantum well structure as shown in FIG. 3, the group III nitride semiconductor layer composed of $Ga_{1-y}In_yN$ ($0 < y < 0.4$) is usually used. The thickness of the well layer 150b may be the thickness by which quantum effects can be obtained, for example, 1 nm to 10 nm, and is preferably 2 nm to 6 nm in terms of light emission output.

Moreover, in the case of the light emitting layer 150 having the multiple quantum well structure, the above-described $Ga_{1-y}In_yN$ is employed as the well layer 150b, and $Al_zGa_{1-z}N$ ($0 \leq z < 0.3$) having a band gap energy larger than that of the well layer 150b is employed as a barrier layer 150a. The well layer 150b and the barrier layer 150a may be doped or not doped with impurities depending upon a design thereof.

<P-Type Semiconductor Layer>

As shown in FIG. 3, the p-type semiconductor layer 160 as an example of a second semiconductor layer is usually configured with the p-cladding layer 160a and the p-contact layer 160b. Further, the p-contact layer 160b can also serve as the p-cladding layer 160a.

The p-cladding layer 160a performs confinement of carriers within the light emitting layer 150 and injection of carriers. The p-cladding layer 160a is not particularly limited as long as the band gap energy of the composition thereof is larger than that of the light emitting layer 150 and carriers can be confined within the light emitting layer 150, but is preferably composed of $Al_xGa_{1-x}N$ ($0 < x \leq 0.4$).

It is preferable that the p-cladding layer 160a is composed of such AlGaN in terms of confinement of carriers within the light emitting layer 150. The thickness of the p-cladding layer 160a is not particularly limited, but preferably 1 nm to 400 nm, and more preferably 5 nm to 100 nm.

The p-type doping concentration of the p-cladding layer 160a is preferably $1 \times 10^{18}/cm^3$ to $1 \times 10^{21}/cm^3$, and more preferably $1 \times 10^{19}/cm^3$ to $1 \times 10^{20}/cm^3$. If the p-type doping concentration is in the above ranges, excellent p-type crystals can be obtained without deteriorating crystallinity.

Further, the p-cladding layer 160a may have a superlattice structure in which the layer is laminated plural times of these structures, and preferably has an alternating structure of AlGaN and AlGaN or an alternating structure of AlGaN and GaN.

The p-contact layer 160b is a layer for providing the first electrode 170. The p-contact layer 160b is preferably composed of $Al_xGa_{1-x}N$ ($0 \leq x \leq 0.4$). It is preferable that Al composition is in the above-described range in terms of allowing to maintain excellent crystallinity and good ohmic contact with the first electrode 170.

It is preferable to contain p-type impurities (dopant) in a concentration of $1 \times 10^{18}/cm^3$ to $1 \times 10^{21}/cm^3$, and preferably $5 \times 10^{19}/cm^3$ to $5 \times 10^{20}/cm^3$ in terms of maintaining good ohmic contact, preventing from cracking and maintaining excellent crystallinity. The p-type impurities are not particularly limited, but, for example, Mg is preferably provided.

The thickness of the p-contact layer 160b is not particularly limited, but is preferably 0.01 μm to 0.5 μm, and more preferably 0.05 μm to 0.2 μm. It is preferable to provide the thickness of the p-contact layer 160b in these ranges in terms of light emission output.

<First Electrode>

Next, the configuration of the first electrode 170 will be described in detail.

The first electrode 170 includes: a first conductive layer 171 laminated on the p-type semiconductor layer 160; a reflection layer 172 (also referred to as a metal layer) laminated on the first conductive layer 171; the second conductive layer 173 laminated on the reflection layer 172; and the coating layer 174 provided so as to cover the first conductive layer 171, the reflection layer 172 and the second conductive layer 173 with respect to the p-type semiconductor layer 160.

<First Conductive Layer>

As shown in FIG. 1, the first conductive layer 171 is laminated on the p-type semiconductor layer 160.

In a planar view as shown in FIG. 2, the first conductive layer 171 (refer to FIG. 1) is formed to cover almost of all but an edge portion of the top surface 160c of the p-type semiconductor layer 160, a part of which has been removed by etching or the like so as to form the second electrode 180, however, the shape thereof is not limited thereto, and the layer may be formed in a lattice pattern or a tree pattern with some openings. However, in FIG. 2, the first conductive layer 171 is formed on the backside of the second conductive layer 173 and hidden behind thereof.

As the first conductive layer 171, it is preferable to employ those that can make an ohmic contact with the p-type semiconductor layer 160 and has small contact resistance with the p-type semiconductor layer 160. Further, in the semiconductor light emitting element 1, since the light from the light emitting layer 150 is outputted to the substrate 110 side via the reflection layer 172, it is preferable to employ those having excellent optical permeability as the first conductive layer 171. Still further, for uniformly passing a current over the entire surface of the p-type semiconductor layer 160, it is preferable to use the first conductive layer 171 having excellent conductivity and narrow resistance distribution. Moreover, in the exemplary embodiment, the thickness of the first conductive layer 171 is set to 5 nm (50 Å). It should be noted that the thickness of the first conductive layer 171 can be selected from the range of 2 nm to 18 nm. Here, if the thickness of the first conductive layer 171 is less than 2 nm, there are some cases where an ohmic contact with the p-type semiconductor layer 160 is hardly available, and if the thickness of the first conductive layer 171 is more than 18 nm, there are some cases that are not preferable in terms of optical permeability to the light emitted from the light emitting layer 150 and the light reflected from the reflection layer 172.

An example of the first conductive layer 171 may be a transparent conductive layer. In the exemplary embodiment, for example, an oxide conductive material having excellent optical permeability to the light of a wavelength emitted from the light emitting layer 150 is used as the first conductive layer 171. In particular, part of oxides containing In is preferable in the point that both optical permeability and conductivity thereof are superior to other transparent conductive films. Examples of conductive oxides containing In include: ITO (indium tin oxide ($In_2O_3$—$SnO_2$)); IZO (indium zinc oxide ($In_2O_3$—$ZnO$)); IGO (indium gallium oxide ($In_2O_3$—$Ga_2O_3$)); and ICO (indium cerium oxide ($In_2O_3$—$CeO_2$)). It should be noted that a dopant such as fluorine may be added to these materials. Further, for example, oxides not containing In, such as carrier-doped $SnO_2$, $ZnO_2$ and $TiO_2$ may be employed.

The first conductive layer 171 can be formed by providing these materials by any well-known method in this technical field. Moreover, there are some cases where thermal annealing is performed for improving permeability and further reducing resistance of the first conductive layer 171 after forming the first conductive layer 171.

In the exemplary embodiment, as the first conductive layer 171, those having a crystallized structure may be used, and in particular, a transparent material containing $In_2O_3$ crystals having a crystal structure of a hexagonal system or a bixbyite structure (for example, ITO or IZO) can be preferably used.

For instance, in the case where IZO containing $In_2O_3$ crystals having a crystal structure of a hexagonal system is used as the first conductive layer 171, an amorphous IZO film that has an excellent etching property can be used and processed into a specific shape, and thereafter, processed into an electrode that is excellent in optical permeability than the amorphous IZO film by transferring the amorphous state into a structure containing crystals through a heat treatment or the like.

Further, as the IZO film used for the first conductive layer 171, it is preferable to use a composition showing the lowest specific resistance.

For example, a ZnO concentration in IZO is preferably 1% by mass to 20% by mass, and more preferably in a range of 5% by mass to 15% by mass. 10% by mass is especially preferred.

The heat treatment of the IZO film used for the first conductive layer 171 is desirably performed in an atmosphere not containing $O_2$, and as the atmosphere not containing $O_2$, an inert gas atmosphere such as $N_2$ atmosphere or a mixed gas atmosphere of $H_2$ and an inert gas such as $N_2$ can be provided, and accordingly, the $N_2$ atmosphere or the mixed gas atmosphere of $N_2$ and $H_2$ is desirable. It should be noted that, if the heat treatment of the IZO film is performed in the $N_2$ atmosphere or the mixed gas atmosphere of $N_2$ and $H_2$, it is possible to, for example, crystallize the IZO film into a film containing $In_2O_3$ crystals having a crystal structure of a hexagonal system and effectively reduce a sheet resistance of the IZO film.

Further, the heat treatment temperature of the IZO film is preferably 500° C. to 1000° C. If the heat treatment is performed at a temperature less than 500° C., a possibility occurs that the IZO film cannot be crystallized sufficiently, thus, in some cases optical permeability of the IZO film is not sufficiently high. If the heat treatment is performed at a temperature more than 1000° C., the IZO film is crystallized but sometimes the optical permeability of the IZO film is not sufficiently high. Further, if the heat treatment is performed at a temperature more than 1000° C., there is a possibility of deteriorating the semiconductor layer provided below the IZO film.

In the case of crystallizing the IZO film in an amorphous state, differences in layer forming conditions or heat treatment conditions result in a difference in a crystal structure of the IZO film. However, in the exemplary embodiment according to the present invention, in terms of adherability to other layers, the material of the first conductive layer 171 is not limited but a crystalline material is preferred, and in particular, in the case of crystalline IZO, IZO may contain a bixbyite crystal structure or $In_2O_3$ crystals having a crystal structure of a hexagonal system. Particularly, IZO containing $In_2O_3$ crystals having a crystal structure of a hexagonal system is preferred.

Especially, as described above, the IZO film crystallized by the heat treatment shows better adhesion properties to the p-type semiconductor 160 than those of the IZO film in an amorphous state, thus being very effective in the exemplary embodiment according to the present invention. Moreover, since the resistance is reduced in the IZO film crystallized by the heat treatment compared to that in the IZO film in an amorphous state, the IZO film crystallized by the heat treatment is preferred in the point that the forward voltage Vf can be reduced when the semiconductor light emitting element 1 is configured.

<Reflection Layer>

As shown in FIG. 1, the reflection layer 172 is laminated on the first conductive layer 171.

In a planar view as shown in FIG. 2, the reflection layer 172 (refer to FIG. 1) is formed to cover the whole area of the first conductive layer 171. Further, the reflection layer 172 is formed on the first conductive layer 171, and is configured not to be formed on the p-type semiconductor layer 160. In other words, the p-type semiconductor layer 160 and the reflection layer 172 are configured not to contact each other directly. However, in FIG. 2, similar to the above-described first conductive layer 171, the reflection layer 172 is formed on the backside of the second conductive layer 173 and hidden behind thereof.

The reflection layer 172 as an example of a metal layer is configured with Ag (silver). The reason why silver is employed as the reflection layer 172 is that silver has high light reflectivity to the light of the wavelength in blue to green regions emitted from the light emitting layer 150. Also, as will be described later, the reason is that the resistance of the reflection layer 172 is low because the reflection layer 172 has a function for feeding to the p-type semiconductor layer 160 through the first conductive layer 171, and in addition, it is required to keep the contact resistance with the first conductive layer 171 low. In the exemplary embodiment, the thickness of the reflection layer 172 is set to 100 nm (1000 Å). The thickness of the reflection layer 172 is preferably selected from the range of 50 nm or more. Here, if the thickness of the reflection layer 172 is less than 50 nm, there are some cases that are not preferable in terms of deterioration of reflective performance of light emitted from the light emitting layer 150.

It should be noted that the simple substance of Ag is used as the reflection layer 172 in the exemplary embodiment, however, an alloy containing Ag may also be used.

<Second Conductive Layer>

As shown in FIG. 1, the second conductive layer 173 is laminated on the reflection layer 172.

In a planar view as shown in FIG. 2, the second conductive layer 173 is formed to cover the whole area of the reflection layer 172. Further, the second conductive layer 173 is formed on the reflection layer 172, and is configured not to be formed on the p-type semiconductor layer 160. In other words, the p-type semiconductor layer 160 and the second conductive layer 173 are configured not to contact each other directly.

As the second conductive layer 173 as an example of a conductive layer, it is preferable to employ those that can make an ohmic contact with the reflection layer 172 and has small contact resistance with the reflection layer 172. However, as will be described later, the second conductive layer 173 is not required to have a function for transmitting the light from the light emitting layer 150, and accordingly, as distinct from the above-described first conductive layer 171, there is no need to have optical permeability. Further, as will be described later, since the second conductive layer 173 has a function for feeding to the p-type semiconductor layer 160 through the reflection layer 172 and the first conductive layer 171, it is preferable to use those having excellent conductivity and narrow resistance distribution. In the exemplary embodiment, the thickness of the second conductive layer 173 is set to 50 nm (500 Å). In the exemplary embodiment, the thickness of the second conductive layer 173 of 50 nm or more is preferred in terms of easiness in suppression of migration of silver (Ag) constituting the reflection layer 172. In contrast, if the thickness of the second conductive layer 173 is less than 50 nm, it is not preferable in terms of prevention of migration of silver (Ag) to the coating layer 174 formed on the second conductive layer 173. Further, the thickness of the second conductive layer 173 of more than 5000 nm is not preferable in terms of the material cost increase. It should be noted that, in the exemplary embodiment, thickness of each of the first conductive layer 171 and the second conductive layer 173 is set so that the first conductive layer 171 becomes thinner than the second conductive layer 173.

In the exemplary embodiment, similar to the first conductive layer 171, IZO is used as the second conductive layer 173. However, as will be described later, since the heat treatment is not performed on IZO for the second conductive layer 173, IZO stays in the amorphous state.

It should be noted that, other than IZO, ITO, IGO, ICO and the like may be used as the second conductive layer 173. Moreover, conductive materials such as carrier-doped $SnO_2$, $ZnO_2$, $TiO_2$ and the like may also be used. Further, since the second conductive layer 173 is not required to have optical permeability as described above, publicly-known conductive metal oxides that absorb light in a visible region may also be used.

<Coating Layer>

As shown in FIG. 1, the coating layer 174 is formed on the top surface of the second conductive layer 173, and the side surfaces of the first conductive layer 171, the reflection layer 172 and the second conductive layer 173.

In a planar view as shown in FIG. 2, the coating layer 174 is formed to cover the whole area of the first conductive layer 171, the reflection layer 172 and the second conductive layer 173. Further, the coating layer 174 is configured so that each of end portions thereof contacts the p-type semiconductor layer 160.

The innermost surface of the coating layer 174, which contacts the second conductive layer 173 or the like, is formed of at least one or more metal layers. Further, as the outermost surface metal layer, gold is commonly used. As an example of the configuration of the coating layer 174, a configuration can be provided which includes: a Ni (nickel) layer as a first layer formed in contact with the second conductive layer 173; a Pt (platinum) layer as a second layer formed on the outside of the Ni layer; and an Au (gold) layer as a third layer formed on the outside of the Pt layer, namely, on the outermost side. The thickness of the entire coating layer 174 is not limited as long as the thickness provides a function of a pad electrode in flip-chip bonding, but preferably set in a range of 50 nm (500 Å) to 8000 nm (80000 Å).

It should be noted that, as a material constituting the first layer of the coating layer 174, other than Ni (nickel) as described above, Ta (tantalum), Ti (titanium), a NiTi (nickel-titanium) alloy and nitride of these materials can be used.

<Second Electrode>

As for the second electrode 180, materials, structures and shapes which are publicly known can be employed, and for example, the configuration same as the first electrode 170 can be employed. Accordingly, the second electrode 180 can be configured with a single layer or a laminated layer in which plural materials are laminated.

<Protection Layer>

As shown in FIG. 1, the protection layer 190 is laminated to cover the first electrode 170 and the second electrode 180 except for a part of each thereof. The protection layer 190 is configured with a material of, for example, $SiO_2$, and provided with a function for suppressing leakage of water or the like from the outside into the first electrode 170 and the second electrode 180 to protect them.

Next, how to use the semiconductor light emitting element 1 shown in FIG. 1 will be described.

Figure 4:
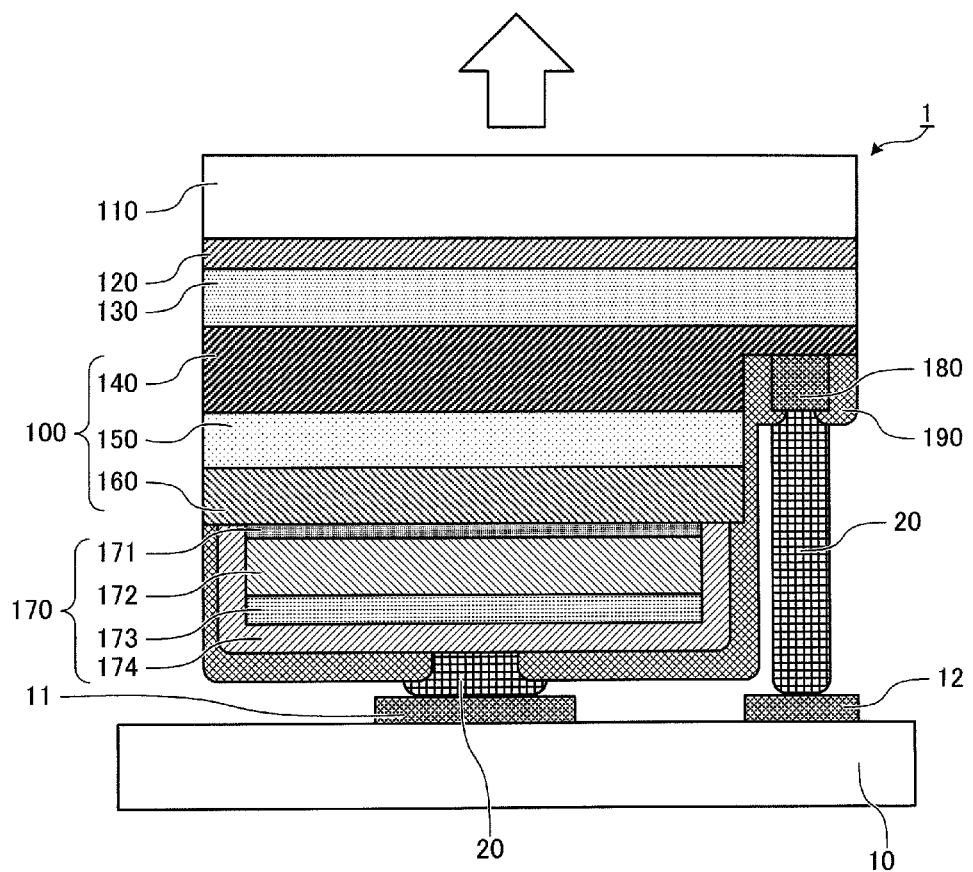
FIG. 4 is a diagram showing an example of a light emitting apparatus in which the semiconductor light emitting element is mounted on a substrate by flip-chip bonding.

FIG. 4 shows an example of configuration of a light emitting device in which the semiconductor light emitting element 1 shown in FIG. 1 is mounted on a wiring board 10.

On a surface of the wiring board 10, an anode 11 and a cathode 12 are formed.

With respect to the wiring board 10 in a state where the semiconductor light emitting element 1 shown in FIG. 1 is turned upside down, the first electrode 170 (specifically, the coating layer 174) and the second electrode 180 are electrically connected using solders 20 and mechanically fastened to the anode 11 and the cathode 12, respectively. Such a method of connecting the semiconductor light emitting element 1 to the wiring board 10 is generally referred to as flip-chip bonding. In the flip-chip bonding, the substrate 110 of the semiconductor light emitting element 1 is placed at a farther position than the light emitting layer 150 as viewed from the wiring board 10.

Then a light emitting operation of the light emitting device shown in FIG. 4 will be described.

When a current from the anode 11 to the cathode 12 is fed through the semiconductor light emitting element 1 via the anode 11 and the cathode 12 of the wiring board 10, in the semiconductor light emitting element 1, a current from the first electrode 170 to the second electrode 180 is passed through the p-type semiconductor layer 160, the light emitting layer 150 and the n-type semiconductor layer 140, and thereby the light emitting layer 150 outputs blue light toward the substrate 110 and the first electrode 170. It should be noted that, at that time, in the first electrode 170, a current is passed through the coating layer 174, the second conductive layer 173, the reflection layer 172 and the first conductive layer 171, and a current in a state of being uniform on a surface is fed to the p-type semiconductor layer 160.

Among the light emitted from the light emitting layer 150, light heading for the substrate 110 passes through the n-type semiconductor layer 140, the base layer 130, the intermediate layer 120 and the substrate 110 and is radiated in a direction of the arrow in FIG. 4. On the other hand, light heading for the first electrode 170 among the light emitted from the light emitting layer 150 reaches the reflection layer 172 through the p-type semiconductor layer 160 and the first conductive layer 171, and is reflected by the reflection layer 172. Then the light reflected by the reflection layer 172 passes through the first electrode 171, the p-type semiconductor layer 160, the light emitting layer 150, the n-type semiconductor layer 140, the base layer 130, the intermediate layer 120 and the substrate 110, and is radiated in the direction of the arrow in FIG. 4. In this manner, the exemplary embodiment provides the reflection layer 172 in the semiconductor light emitting element 1 to reflect the light radiated from the light emitting layer 150 to an opposite side of the substrate 110, thus increasing the light extraction efficiency from the semiconductor light emitting element 1.

Next, a method for producing the semiconductor light emitting element 1 shown in FIG. 1 will be described.

Figure 5:
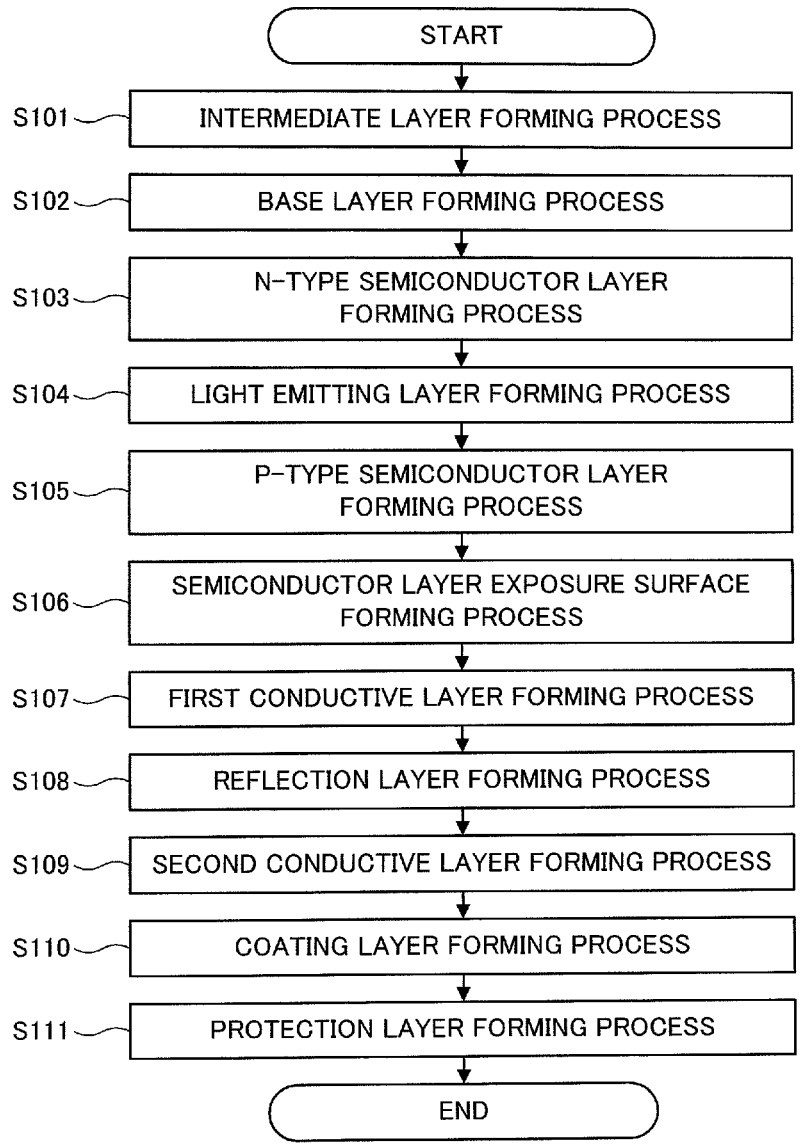
FIG. 5 is a flowchart showing an example of a production process of the semiconductor light emitting element.

FIG. 5 is a flowchart showing an example of a production process of the semiconductor light emitting element 1.

The semiconductor light emitting element 1 is produced by: an intermediate layer forming process (step 101) to form the intermediate layer 120 on the substrate 110; a base layer forming process (step 102) to form the base layer 130 on the intermediate layer 120; an n-type semiconductor layer forming process (step 103) to form the n-type semiconductor layer 140 on the base layer 130; a light emitting layer forming process (step 104) to form the light emitting layer 150 on the n-type semiconductor layer 140; a p-type semiconductor layer forming process (step 105) to form the p-type semiconductor layer 160 on the light emitting layer 150; a semiconductor layer exposure surface forming process (step 106) to form the semiconductor layer exposure surface 140c on the n-type semiconductor layer 140 by etching from the p-type semiconductor layer 160 side; a first conductive layer forming process (step 107) to form the first conductive layer 171 on the p-type semiconductor layer 160; a reflection layer forming process (step 108) to form the reflection layer 172 on the first conductive layer 171; a second conductive layer forming process (step 109) to form the second conductive layer 173 on the reflection layer 172; a coating layer forming process (step 110) to form the coating layer 174 to cover the first conductive layer 171, the reflection layer 172 and the second conductive layer 173; and a protection layer forming process (step 111) to form the protection layer 190.

Hereafter, each process will be described in order.

<Intermediate Layer Forming Process>

First, the substrate 110 which is a sapphire substrate or the like is prepared and is subjected to preprocessing. The preprocessing can be performed by a method of, for example, placing the substrate 110 in a chamber of a sputtering device and conducting sputtering before forming the intermediate layer 120. Specifically, preprocessing for cleaning the top surface of the substrate 110 by exposing thereof in plasma of Ar or $N_2$ may be performed. Organic substances or oxides adhered to the top surface of the substrate 110 can be removed by the action of plasma of Ar gas or $N_2$ gas on the substrate 110.

Next, on the top surface of the substrate 110, the intermediate layer 120 is laminated by the sputtering method.

In the case of forming the intermediate layer 120 having a single crystal structure by the sputtering method, as for the ratio of a flow rate of nitrogen to a flow rate of nitrogen materials and inert gases in the chamber, the nitrogen materials desirably account for 50% to 100%, and more desirably 75%.

Further, in the case of forming the intermediate layer 120 having columnar crystals (polycrystals) by the sputtering method, as for the ratio of the flow rate of nitrogen to the flow rate of nitrogen materials and inert gases in the chamber, the nitrogen materials desirably account for 1% to 50%, and more desirably 25%. It should be noted that the intermediate layer 120 can be formed not only by the sputtering method, but also by the MOCVD method.

<Base Layer Forming Process>

Next, after forming the intermediate layer 120, the base layer 130 of a single crystal is formed on the top surface of the intermediate layer 120. The base layer 130 may be formed by the sputtering method or the MOCVD method.

<N-Type Semiconductor Layer Forming Process>

After forming the base layer 130, the n-type semiconductor layer 140 is formed by laminating the n-contact layer 140a and the n-cladding layer 140b. The n-contact layer 140a and the n-cladding layer 140b may be formed by the sputtering method or the MOCVD method.

<Light Emitting Layer Forming Process>

Formation of the light emitting layer 150 may be performed by either method of sputtering or MOCVD, but especially, the MOCVD method is preferred. Specifically, the barrier layers 150a and the well layers 150b may be alternately and repeatedly laminated such that the barrier layers 150a are located to face the n-type semiconductor layer 140 and the p-type semiconductor layer 160.

<P-Type Semiconductor Layer>

Further, formation of the p-type semiconductor layer 160 may be performed by either method of sputtering or MOCVD. Specifically, the p-cladding layers 160a and the p-contact layers 160b may be laminated in turn.

<Semiconductor Layer Exposure Surface Forming Process>

Prior to forming the first electrode 170, the semiconductor layer exposure surface 140c is formed by performing patterning by a publicly-known photolithographic method, etching a part of the laminated semiconductor layer 100 in a predetermined region, and exposing a part of the n-contact layer 140a.
<First Conductive Layer Forming Process>

The semiconductor layer exposure surface 140c is covered with a mask and the first conductive layer 171 is formed on the p-type semiconductor layer 160, which is not removed by etching and left, by any known method such as sputtering, and thereafter, a heat treatment is performed at a temperature of 700° C. under, for example, an oxygen atmosphere to increase crystallinity of the first conductive layer 171.

It should be noted that the semiconductor layer exposure surface 140c may be formed by, after the first conductive layer 171 is formed on the p-type semiconductor layer 160 in advance, etching a part of a predetermined region of the first conductive layer 171 and a part of the laminated semiconductor layer 100 in the state where the first conductive layer 171 has been formed. In this case, it is also preferable to increase crystallinity of the first conductive layer 171 by performing the heat treatment after forming the first conductive layer 171.
<Reflection Layer Forming Process>

With the semiconductor layer exposure surface 140c continuously covered with the mask, the reflection layer 172 is formed on the first conductive layer 171 having been laminated on the p-type semiconductor layer 160 by any known method such as sputtering.

It should be noted that it is preferable to perform the reflection layer forming process and the first conductive layer forming process separately. This is because the heat treatment is performed in the first conductive layer forming process as described above. To be more specifically described, if the heat treatment is performed in the state where the first conductive layer 171 and the reflection layer 172 are formed on the p-type semiconductor layer 160, there is a possibility that Ag constituting the reflection layer 172 is dispersed into the first conductive layer 171, and thereby a reflectance in the reflection layer 172 is reduced.
<Second Conductive Layer Forming Process>

With the semiconductor layer exposure surface 140c continuously covered with the mask, the second conductive layer 173 is formed on the reflection layer 172 having been laminated on the first conductive layer 171 by any known method such as sputtering.

It should be noted that it is preferable to perform the reflection layer forming process and the second conductive layer forming process continuously in a batch by, for example, the sputtering method, and in such a case, it is preferable that each of the material constituting the reflection layer 172 and the material constituting the second conduction layer 173 are set in a sputtering device as the targets, and the target and the atmosphere are changed during the progress of the layer forming process for continuous formation.

Further, after the second conductive layer forming process, it is preferable not to perform the heat treatment. This is because, if the heat treatment is performed in the state where the second conductive layer 173 is formed on the reflection layer 172 laminated on the first conductive layer 171, there is a possibility that Ag constituting the reflection layer 172 is dispersed into the first conductive layer 171 or the second conductive layer 173, and thereby a reflectance in the reflection layer 172 is reduced.

The second electrode 180 is configured to have the same structure as the first electrode 170, and it is possible to form both electrodes simultaneously after the semiconductor layer exposure surface 140c is formed in the semiconductor layer exposure surface forming process. As the second electrode 180, it is also possible to form an electrode having any known structure before, after or in the course of the forming process of the first electrode 170.
<Coating Layer Forming Process>

With the semiconductor layer exposure surface 140c continuously covered by the mask, the coating layer 174 made of metal is laminated by the sputtering method on the first conductive layer 171, the reflection layer 172 and the second conductive layer 173 which have been laminated on the p-type semiconductor layer 160 to completely cover the first conductive layer 171, the reflection layer 172 and the second conductive layer 173 together with the p-type semiconductor layer 160. For example, as the coating layer 174, a nickel layer, a platinum layer and a gold layer are successively laminated.

It should be noted that it is preferable to perform the coating layer forming process separately from the above-described second conductive layer forming process. In this case, the first conductive layer 171, the reflection layer 172 and the second conductive layer 173 laminated on the top surface 160c of the p-type semiconductor layer 160 are taken out of a layer forming device such as a sputtering device, however, since the reflection layer 172 is covered with the second conductive layer 173, the reflection layer 172 is hardly exposed to atmosphere; therefore deterioration of the reflection layer 172 can be suppressed.
<Protection Layer Forming Process>

After removing the mask that covers the semiconductor layer exposure surface 140c, the protection layer 190 made of, for example, $SiO_2$ is formed on the top surface and the etched side surface as shown in FIG. 1. It should be noted that, to expose a partial region of the first electrode 171 and a partial region of the second electrode 180, for example, a resist coating may be formed before formation of the protection layer 190, or the exposure region may be formed by use of dry etching method or the like after the protection layer 190 is formed.

Thus, the semiconductor light emitting element 1 is obtained.

When the light emitting device shown in FIG. 4 is configured by using the semiconductor light emitting element 1, the first electrode 170 and the second electrode 180 provided in the semiconductor light emitting element 1 are connected to the anode 11 and the cathode 12 provided on the wiring board 10, respectively, by using the solders 20. It should be noted that the temperature of the solders 20 at this time is set to, for example, 300° C. or less, and dispersion of silver constituting the reflection layer 172 into the first electrode 171 side or the second electrode 173 side is suppressed by overheating of the reflection layer 172 through the solders 20.

Incidentally, it is known that Ag used as the reflection layer 172 of the semiconductor light emitting element 1 according to the exemplary embodiment brings about ion migration (electrochemical migration) in which Ag is eluted and reduced as ion and migrates in an ionic state due to chemical and thermal factors. The extent of occurrence of the ion migration of Ag constituting the reflection layer 172 varies with materials to be in contact with the reflection layer 172.

In the exemplary embodiment, the reflection layer 172 is formed so that one of the surfaces thereof is in contact with the first conductive layer 171 and the other is in contact with the second conductive surface 173. As will be explained in a later-described exemplary embodiment, it has been proved that, if the second conductive layer 173 composed of metal such as Ni and Ti is formed on the other surface of the reflection layer 172, Ag in a dendrite state is precipitated between the reflection layer 172 and the second conductive layer 173. In the case where Ag in the dendrite state is precipitated on an interface between the reflection layer 172 and the second conductive layer 173, a light reflectance in the reflection layer 172 is reduced, and as a result, the extraction efficiency of light emitted from the substrate 110 of the semiconductor light emitting element 1 is significantly deteriorated.

Regarding this, in the exemplary embodiment, the second conductive layer 173 composed of an oxide, not metal, was formed on the reflection layer 172. As will be explained in a later-described exemplary embodiment, it has been proved that, if the second conductive layer 173 is formed on the reflection layer 172, Ag in the dendrite state associated with migration of Ag becomes resistant to precipitate. Consequently, the reflective performance of the reflection layer 172 is maintained by forming the second conductive layer 173 composed of an oxide on the reflection layer 172, and thereby deterioration of the light extraction efficiency in the semiconductor light emitting element 1 can be suppressed.

Further, in the exemplary embodiment, the second conductive layer 173 and the p-type semiconductor layer 160 are configured not to directly contact each other by forming the first conductive layer 171 on the p-type semiconductor layer 160, forming the reflection layer 172 on the first conductive layer 171, and further forming the second conductive layer 173 on the reflection layer 172. Since the second conductive layer 173 is not necessarily transparent to the light from the light emitting layer 150, if, for example, the second conductive layer 173 and the p-type semiconductor layer 160 are configured to directly contact each other, there is a possibility that the light from the light emitting layer 150 is absorbed by the second conductive layer 173. However, by employing such a configuration, the exemplary embodiment can suppress deterioration in the light extraction efficiency in the semiconductor light emitting element 1 due to light absorption of the second conductive layer 173.

Moreover, in the exemplary embodiment, the first conductive layer 171, the reflection layer 172 and the second conductive layer 173 formed in order on the p-type semiconductor layer 160 in this manner are configured to be coated with the coating layer 174. Accordingly, exposure of the reflection layer 172 composed of, for example, silver to an outside air is avoided, and thereby deterioration of silver caused by reaction with water, oxygen or the like and the reduction in the light extraction efficiency in the semiconductor light emitting element 1 accompanied therewith can be suppressed over the long term.

<Another Configuration Example of First Electrode>

Figure 6:
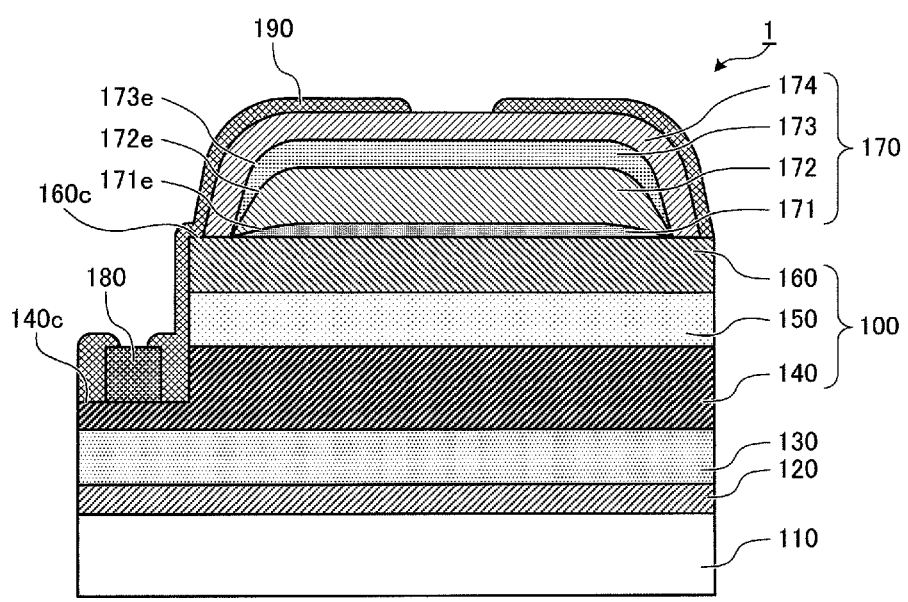
FIG. 6 is another example of the schematic cross-sectional view of the semiconductor light emitting element.

FIG. 6 illustrates another example of the schematic cross-sectional view of the semiconductor light emitting element 1 to which the exemplary embodiment is applied. The basic configuration of the semiconductor light emitting element 1 is almost same as that shown in FIG. 1, but there is a feature in the cross-sectional shape of the first electrode 170.

Similar to that shown in FIG. 1, the semiconductor light emitting element 1 includes the first conductive layer 171, the reflection layer 172, the second conductive layer 173 and the coating layer 174. It should be noted that the following points are same as that mentioned above: the first conductive layer 171 composed of an oxide transparent conductive material; the reflection layer 172 composed of silver or an alloy containing silver; the second conductive layer 173 composed of an oxide conductive material; and the coating layer 174 composed of metal.

The first conductive layer 171 is formed to cover almost all but an end portion of the top surface 160c of the p-type semiconductor layer 160. Then, the central portion of the first conductive layer 171 has a certain thickness and is formed almost flat with respect to the top surface 160c, whereas, the thickness of the end portion of the first conductive layer is gradually reduced to form an inclined surface 171e that is inclined to the top surface 160c of the p-type semiconductor layer 160.

The reflection layer 172 is formed so as to cover almost all the surface of the first conductive layer 171 and hardly contacts the p-type semiconductor layer 160. The central portion of the reflection layer 172 has a certain thickness and is formed almost flat, whereas, the thickness of an end portion of the reflection layer 172 is gradually reduced to form an inclined surface 172e that is inclined to the top surface 160c of the p-type semiconductor layer 160.

The second conductive layer 173 is formed so as to cover almost all the surface of the reflection layer 172 and hardly contacts the p-type semiconductor layer 160 and the first conductive layer 171. The central portion of the second conductive layer 173 has a certain thickness and is formed almost flat, whereas, the thickness of an end portion side of the second conductive layer 173 is an inclined surface 173e that is inclined to the top surface 160c of the p-type semiconductor layer 160.

The coating layer 174 is formed to cover the top surface of the second conductive layer 173 and the inclined surface 173e, and an end portion thereof is configured to contact the top surface 160c of the p-type semiconductor layer 160.

In this manner, in the exemplary embodiment, the reflection layer 172 is sandwiched by the first conductive layer 171 and the second conductive layer 173 in the state where the end portions of the reflection layer 172 are hardly exposed to the outside. Then, the first conductive layer 171, the reflection layer 172 and the second conductive layer 173 thus configured are covered by the coating layer 174 with respect to the p-type semiconductor layer 160. Consequently, in the exemplary embodiment, the configuration in which the reflection layer 172 and the coating layer 174 hardly make a direct contact is achieved.

FIGS. 7A to 10D are diagrams for illustrating an example of the method for producing the first electrode 170 in the semiconductor light emitting element 1 shown in FIG. 6. Here, FIGS. 7A to 8D correspond to steps 107 to 109 in the flowchart shown in FIG. 5, and FIGS. 9A to 10D correspond to step 110 in the flowchart shown in FIG. 5.

In the first place, production procedures of the first conductive layer 171, reflection layer 172 and the second conductive layer 173 (referred to as a first process) will be described with reference to FIGS. 7A to 8D.

<First Process>

Figure 7A:
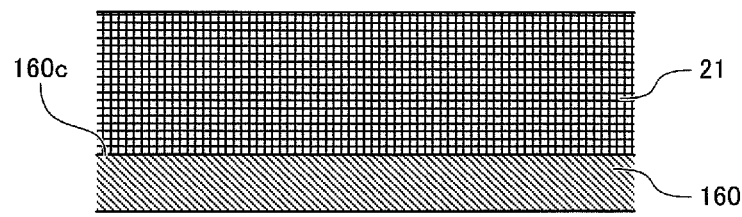
FIGS. 7A to 7C are diagrams for illustrating an example of a production process of a first electrode of the semiconductor light emitting element shown in FIG. 6.

First, as shown in FIG. 7A, an insoluble resist portion 21 is formed on the top surface 160c of the p-type semiconductor layer 160 by using a resist, for example, AZ5200NJ (product name, manufactured by AZ electronic materials).

Figure 7B:
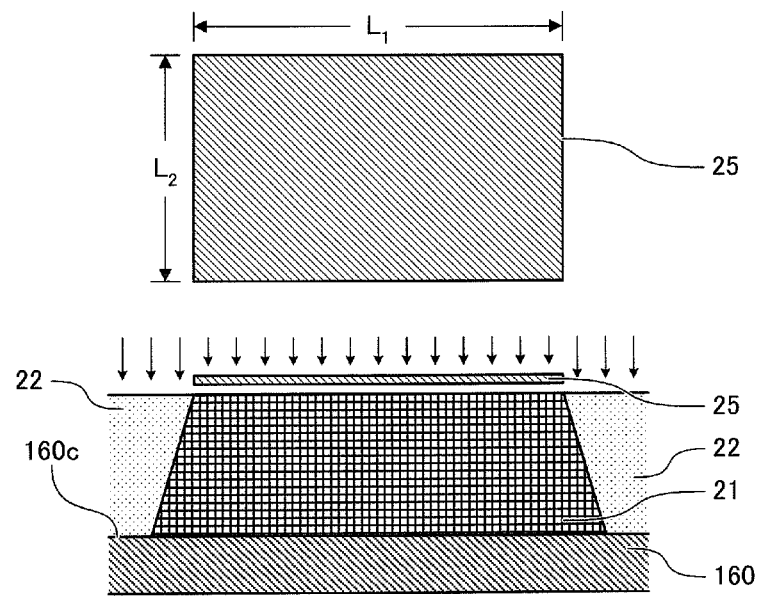

Next, as shown in FIG. 7B, a first mask 25 with a horizontal width $L_1$ and a vertical width $L_2$ is arranged to cover the position where the first electrode 170 is to be formed on the upper surface of the insoluble resist portion 21, and light of a wavelength to which the insoluble resist portion 21 is sensitive is radiated. At this time, the exposed insoluble resist portion 21 is converted into a first soluble resist portion 22 by photoreaction. Further, since the photoreaction progresses in accordance with the intensity of light, the photoreaction progresses fast on the light irradiation surface side, and the photoreaction progresses slowly on the side of the p-type semiconductor layer 160, and as a result, as illustrated in FIG. 7B, the first soluble resist portion 22 is formed to be in a reversely inclined shape (reverse-tapered shape), in which the side surface thereof is inwardly receded toward the lower side (p-type semiconductor layer 160 side). In contrast, the insoluble resist portion 21 covered by the first mask 25 is formed to be in an inclined shape (tapered shape), in which the side surface thereof is inwardly receded toward the upper side.

Figure 7C:
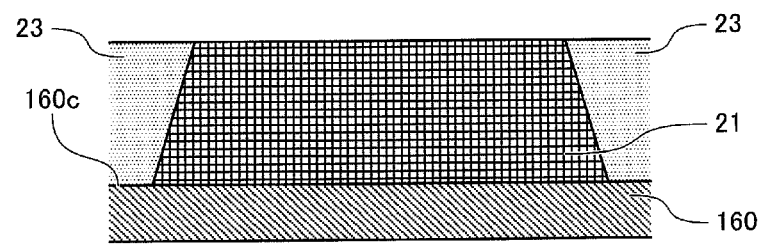
Figure 8A:
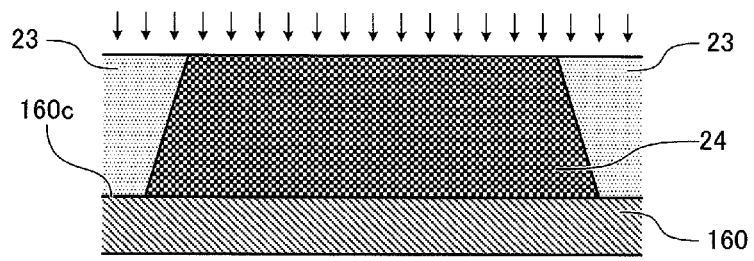
FIGS. 8A to 8D are diagrams for illustrating an example of a production process of a first electrode of the semiconductor light emitting element shown in FIG. 6 (continued)

Next, as illustrated in FIG. 7C, the soluble resist portion 22 is converted into a hardened resist portion 23 by heating, and by subsequently performing entire surface exposure, the insoluble resist portion 21 that has not been exposed by the partial exposure occurs to form a second soluble resist portion 24 as shown in FIG. 8A.

Figure 8B:
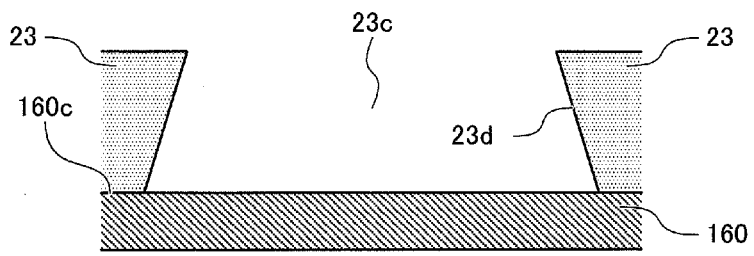

Subsequently, by dissolving and removing the second soluble resist portion 24 by use of a predetermined developing solvent, as illustrated in FIG. 8B, there remains the hardened resist portion 23. The hardened resist portion 23 has a first opening portion 23c with the horizontal width $L_1$ and the vertical width $L_2$ that exposes the top surface 160c of the p-type semiconductor layer 160. A side surface (inner wall surface) 23d of the first opening portion 23c has a reversely inclined shape (reverse-tapered shape) in which the side surface is inwardly receded toward the lower side, and the nearer the first opening portion 23c to the p-type semiconductor layer 160, the longer an opening length thereof becomes, and further, an inclined angle of the side surface (inner wall surface) 23d of the first opening portion 23c is almost constant. This is referred to as a first reversely inclined mask 23 (corresponding to a first mask).

Figure 8C:
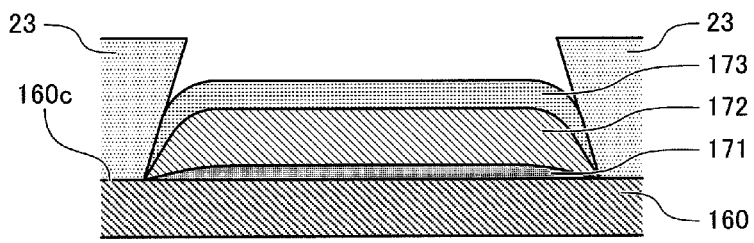

Next, the first conductive layer 171 composed of an oxide transparent conductive material is formed on the top surface 160c of the p-type semiconductor layer 160 through the first reversely inclined mask 23 by the sputtering method. The first conductive layer 171 is formed with the horizontal width $L_1$ and the vertical width $L_2$ of the first opening portion 23c of the first reversely inclined mask 23 as a base length. However, as illustrated in FIG. 8C, on a portion which is away from the sputtering direction (hidden behind), namely, on an outer edge side of the first conductive layer 171, the inclined surface 171e is formed in which the thickness thereof is gradually reduced toward the outer periphery side. It should be noted that the inclined angle of the inclined surface 171e is determined according to the thickness.

Subsequently, the reflection layer 172 composed of silver or a silver alloy is formed on the first conductive layer 171 through the first reversely inclined mask 23 by the sputtering method. The reflection layer 172 is formed with the horizontal width $L_1$ and the vertical width $L_2$ of the first opening portion 23c of the first reversely inclined mask 23 as a base length, however, as illustrated in FIG. 8C, on a hidden behind portion as viewed from the sputtering direction, namely, on an outer edge side of the reflection layer 172, the inclined surface 172e is formed in which the thickness thereof is gradually reduced toward the outer periphery side. It should be noted that the inclined angle of the inclined surface 172e is determined according to the thickness. Further, the reflection layer 172 is formed to cover the first conductive layer 171 completely.

Continuously, the second conductive layer 173 composed of an oxide conductive material is formed on the reflection layer 172 through the first reversely inclined mask 23 by the sputtering method. The second conductive layer 173 is formed with the horizontal width $L_1$ and the vertical width $L_2$ of the first opening portion 23c of the first reversely inclined mask 23 as a base length, however, as illustrated in FIG. 8C, on a hidden behind portion as viewed from the sputtering direction, namely, on an outer edge side of the reflection layer 172, the inclined surface 173e is formed in which the thickness thereof is gradually reduced toward the outer periphery side. It should be noted that the inclined angle of the inclined surface 173e is determined according to the thickness. Further, the second conductive layer 173 is formed to cover the reflection layer 172 completely.

Figure 8D:
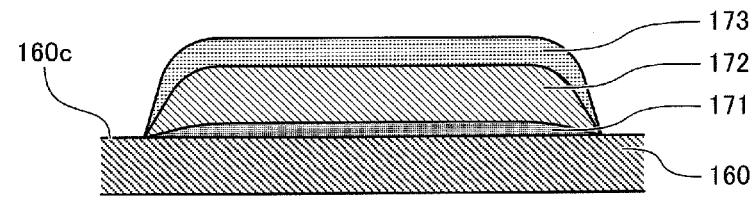

Thereafter, as shown in FIG. 8D, by removing the first reversely inclined mask 23 using a resist releasing agent or the like, there remains only a three-layer structure composed of the first conductive layer 171, the reflection layer 172 and the second conductive layer 173 on the top surface 160c of the p-type semiconductor layer 160.

It should be noted that a pre-process for cleaning the surface of the first conductive layer 171 may be performed before the reflection layer 172 is formed. The cleaning method includes a dry process in which an object is exposed to plasma or the like and a wet process in which an object is made to contact a chemical solution, and in terms of easiness of the process, the dry process is desirable. Further, that goes without saying, after the first conductive layer 171 is formed on the p-type semiconductor layer 160, the reflection layer 172 may be formed after the first conductive layer 171 is crystallized by the heat treatment.

Subsequently, production procedures of the coating layer 174 (referred to as a second process) will be described with reference to FIGS. 9A to 10D.

<Second Process>

Figure 9A:
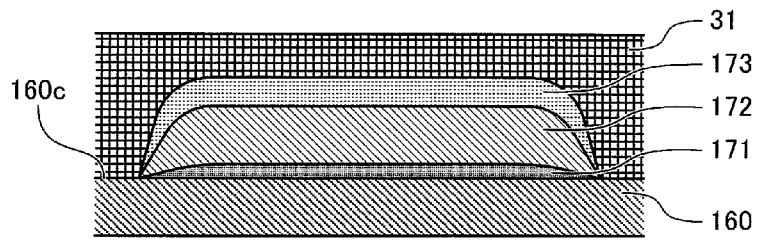
FIGS. 9A to 9C are diagrams for illustrating an example of a production process of a first electrode of the semiconductor light emitting element shown in FIG. 6 (continued)

First, as shown in FIG. 9A, according to the first process, an insoluble resist portion 31 is formed to cover the three-layer structure composed of the first conductive layer 171, the reflection layer 172 and the second conductive layer 173 and the top surface 160c of the p-type semiconductor layer 160 by use of a resist such as AZ5200NJ (product name, manufactured by AZ electronic materials).

Figure 9B:
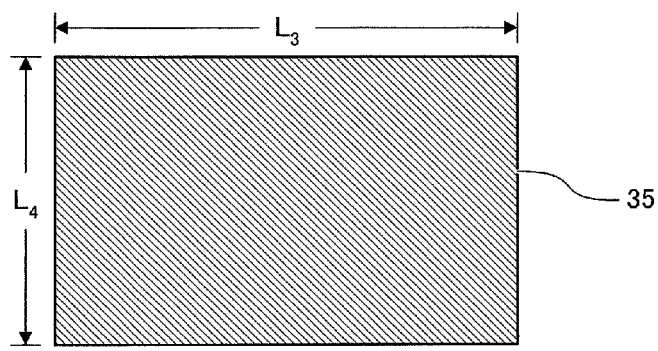
Figure 9B:
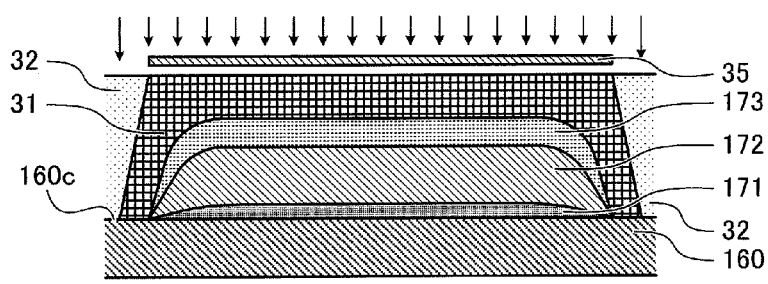

Next, as illustrated in FIG. 9B, a second mask 35 with a horizontal width $L_3$ and a vertical width $L_4$ is arranged to cover the position where the first electrode 170 is to be formed on the upper surface of the insoluble resist portion 31, and light of a wavelength, to which the insoluble resist portion 31 is sensitive, is radiated. It should be noted that the horizontal width $L_3$ of the second mask 35 has a larger value than that of the horizontal width $L_1$ of the first mask 25, and the vertical width $L_4$ of the second mask 35 has a larger value than that of the vertical width $L_2$ of the first mask 25. Further, it is preferable that the second mask 35 is arranged to cover an entire region of the first conductive layer 171, the reflection layer 172 and the second conductive layer 173 laminated in order on the p-type semiconductor layer 160. At this time, the exposed insoluble resist portion 31 is converted into a first soluble resist portion 32 by photoreaction. Further, since the photoreaction progresses in accordance with the intensity of light, the photoreaction progresses fast on the light irradiation surface side, and the photoreaction progresses slowly on the side of the p-type semiconductor layer 160, and as a result, as illustrated in FIG. 9B, the first soluble resist portion 32 is formed to be in a reversely inclined shape (reverse-tapered shape), in which the side surface thereof is inwardly receded toward the lower side (p-type semiconductor layer 160 side). In contrast, the insoluble resist portion 31 covered by the second mask 35 is formed to be in an inclined shape (tapered shape), in which the side surface thereof is inwardly receded toward the upper side.

Figure 9C:
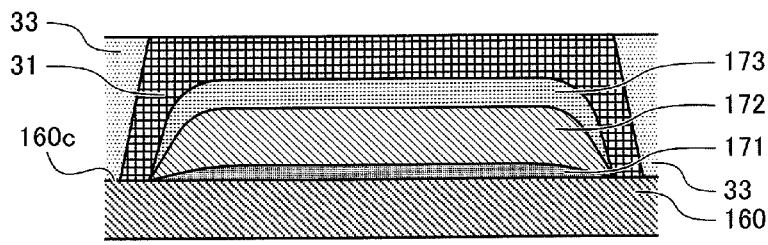
Figure 10A:
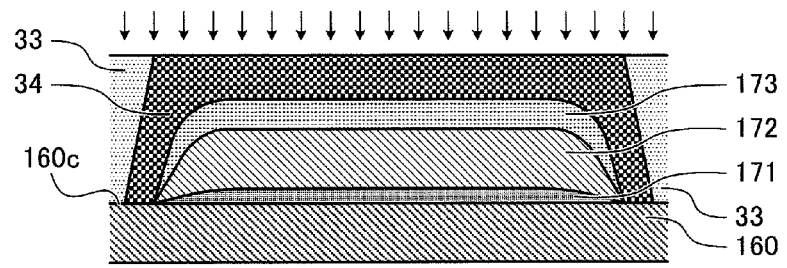
FIGS. 10A to 10D are diagrams for illustrating an example of a production process of a first electrode of the semiconductor light emitting element shown in FIG. 6 (continued).

Next, as illustrated in FIG. 9C, the soluble resist portion 32 is converted into a hardened resist portion 33 by heating, and by subsequently performing entire surface exposure, the insoluble resist portion 31 that has not been exposed by the partial exposure occurs to form a second soluble resist portion 34 as shown in FIG. 10A.

Figure 10B:
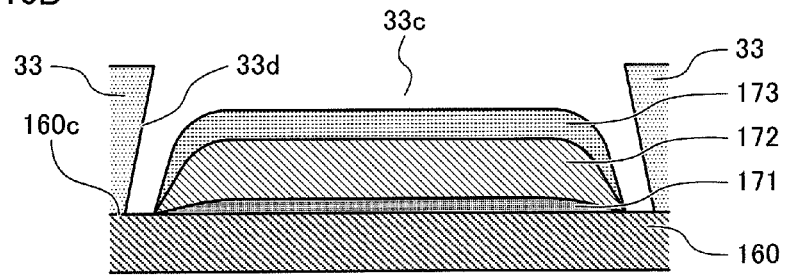
Figure 10C:
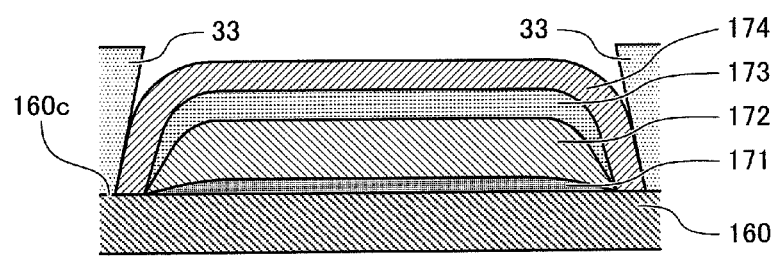

Subsequently, by dissolving and removing the second soluble resist portion 34 by use of a predetermined developing solution, as illustrated in FIG. 10B, there remains the hardened resist portion 33. The hardened resist portion 33 has a second opening portion 33c with the horizontal width $L_3$ and the vertical width $L_4$ for exposing the top surface 160c of the p-type semiconductor layer 160 between the hardened resist portion 33 and the three-layer structure of the first conductive layer 171, the reflection layer 172 and the second conductive layer 173. A side surface (inner wall surface) 33d of the second opening portion 33c has a reversely inclined shape (reverse-tapered shape) in which the side surface is inwardly receded toward the lower side, and the nearer the second opening portion 33c to the p-type semiconductor layer 160, the longer an opening length thereof becomes, and further, an inclined angle of the side surface (inner wall surface) 33d of the second opening portion 33c is almost constant. This is referred to as a second reversely inclined mask 33 (corresponding to a second mask).

Next, by the sputtering method, the coating layer 174 composed of one or plural metal layers is formed on the top surface 160c of the p-type semiconductor layer 160 and the second conductive layer 173 through the second reversely inclined mask 33. At this time, the metal constituting the coating layer 174 enters between the inclined surface 173e of the second conductive layer 173 and the side surface 33d of the second reversely inclined mask 33 to be laminated. Accordingly, the coating layer 174 is formed to cover the top surface and the inclined surface 173e of the second conductive layer 173 and contact the top surface 160c of the p-type semiconductor layer 160 at end portions thereof.

Figure 10D:
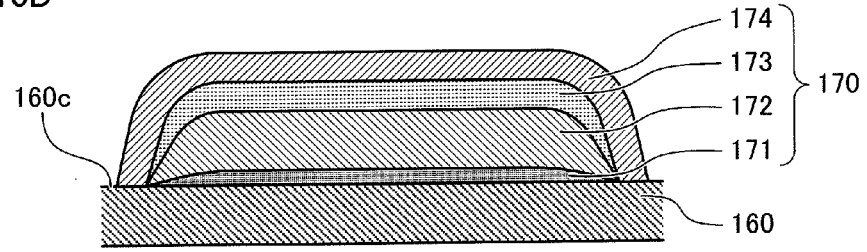

Thereafter, as shown in FIG. 10D, by removing the second reversely inclined mask 33 using a resist releasing agent or the like, the first electrode 170 having the first conductive layer 171, the reflection layer 172, the second conductive layer 173 and the coating layer 174 can be obtained.

In the semiconductor light emitting element 1 shown in FIG. 6, in the first electrode 170, the reflection layer 172 composed of silver or an alloy containing silver and the coating layer composed of metal are arranged to be separated by the second conductive layer 173, thus making it possible to suppress the dispersion of silver into the side of the coating layer 174. Accordingly, by employing such a configuration, reflective performance of the reflection layer 172 is further maintained, and therefore, it becomes possible to further suppress the reduction in the light extraction efficiency in the semiconductor light emitting element 1 compared to the configuration shown in FIG. 1.

EXAMPLE

Next, examples of the present invention will be described, but the present invention is not limited to the examples.

The present inventors have manufactured the semiconductor light emitting elements 1 with the first electrodes 170 of different constituting materials, and have evaluated the deterioration of the reflection layer 172 in each semiconductor light emitting element 1 based on an amount of light outputted from each semiconductor light emitting element 1. It should be noted that the structure of each semiconductor light emitting element 1 was as shown in FIG. 1 or FIG. 6.

Table 1 below shows the configuration of the first electrode 170 (more specifically, the first conductive layer 171, the reflection layer 172, the second conductive layer 173 and the coating layer 174) in Examples 1 to 7 and Comparative examples 1 to 3. Further, Table 2 below shows evaluation results in each of Examples 1 to 7 and Comparative examples 1 to 3.

TABLE 1

| | | First conductive layer | | Reflection layer | | Second conductive layer | | Coating layer | | | | | |
| | | | | | | | | First layer | | Second layer | | Third layer | |
| | Structure | Material | Thickness (Å) | Material | Thickness (Å) | Material | Thickness (Å) | Material | Thickness (Å) | Material | Thickness (Å) | Material | Thickness (Å) |
|---|---|---|---|---|---|---|---|---|---|---|---|---|---|
| Example1 | FIG. 6 | IZO | 50 | Ag | 1000 | IZO | 500 | Ni | 100 | Pt | 1000 | Au | 3000 |
| Example2 | FIG. 6 | ITO | 50 | APC-TR | 1000 | ITO | 500 | Ta | 200 | Pt | 1000 | Au | 3000 |
| Example3 | FIG. 6 | IZO | 50 | Ag | 1000 | ICO | 500 | Ta | 200 | W | 1000 | Au | 3000 |
| Example4 | FIG. 6 | IZO | 50 | Ag | 1000 | IGO | 500 | NiTi | 200 | W | 1000 | Au | 3000 |
| Example5 | FIG. 6 | IZO | 100 | Ag | 2000 | IZO | 500 | Ti | 100 | Pt | 1000 | Au | 4000 |
| Example6 | FIG. 6 | IZO | 100 | Ag | 2000 | IZO | 500 | TaN | 100 | Pt | 1000 | Au | 5000 |
| Example7 | FIG. 1 | IZO | 50 | Ag | 1000 | IZO | 500 | Ni | 100 | Pt | 1000 | Au | 3000 |
| Comparative example1 | FIG. 6 | IZO | 50 | Ag | 1000 | Ni | 1000 | Pt | 1000 | Au | 3000 | — | — |
| Comparative example2 | FIG. 6 | IZO | 50 | Ag | 1000 | Pt | 500 | Pt | 1000 | Au | 3000 | — | — |
| Comparative example3 | FIG. 6 | Pt | 50 | Ag | 1000 | Pt | 500 | Pt | 1000 | Au | 3000 | — | — |

TABLE 2

| | Evaluation results ($\lambda d$ = 60 nm, Applied current 20 mA) | | | | | | | |
| | Room temperature (20° C.) | | 200° C. | | 300° C. | | 400° C. | |
| | Vf (V) | Po (mW) | Vf (V) | Po (mW) | Vf (V) | Po (mW) | Vf (V) | Po (mW) |
|---|---|---|---|---|---|---|---|---|
| Example1 | 3.10 | 22.0 | 3.10 | 22.0 | 3.10 | 22.0 | 3.10 | 22.0 |
| Example2 | 3.10 | 22.0 | 3.10 | 22.0 | 3.10 | 22.0 | 3.10 | 22.0 |

TABLE 2-continued

| | Evaluation results (λ d = 60 nm, Applied current 20 mA) | | | | | | | |
|---|---|---|---|---|---|---|---|---|
| | Room temperature (20° C.) | | 200° C. | | 300° C. | | 400° C. | |
| | Vf (V) | Po (mW) | Vf (V) | Po (mW) | Vf (V) | Po (mW) | Vf (V) | Po (mW) |
| Example3 | 3.10 | 22.0 | 3.10 | 22.0 | 3.10 | 22.0 | 3.10 | 22.0 |
| Example4 | 3.10 | 22.0 | 3.10 | 22.0 | 3.10 | 22.0 | 3.10 | 22.0 |
| Example5 | 3.10 | 22.0 | 3.10 | 22.0 | 3.10 | 22.0 | 3.10 | 22.0 |
| Example6 | 3.10 | 22.0 | 3.10 | 22.0 | 3.10 | 22.0 | 3.10 | 22.0 |
| Example7 | 3.10 | 22.0 | 3.10 | 22.0 | 3.10 | 22.0 | 3.10 | 22.0 |
| Comparative example1 | 3.10 | 22.0 | 3.10 | 22.0 | 3.10 | 22.0 | 3.10 | 21.0 |
| Comparative example2 | 3.10 | 22.0 | 3.10 | 22.0 | 3.10 | 21.0 | 3.10 | 20.0 |
| Comparative example3 | 3.10 | 21.0 | 3.10 | 21.0 | 3.20 | 20.5 | 3.30 | 18.0 |

In Examples 1, 3, 4 and 7 and Comparative examples 1 and 2, all of the first conductive layers 171 were composed of IZO (indium zinc oxide), and the thickness thereof was 50 Å. In Examples 5 and 6, the first conductive layers 171 were also composed of IZO and the thickness thereof was 100 Å. In contrast, the first conductive layer 171 was composed of ITO (indium tin oxide) in Example 2 and Pt (platinum) in Comparative example 3, and the thickness in both cases was 50 Å.

Moreover, in Examples and Comparative examples except for Example 2, all of the reflection layers 172 were composed of Ag (silver), and the thickness of which was 1000 Å in Examples 1, 3, 4 and 7 and Comparative examples 1 to 3, whereas, the thickness of which was 2000 Å in Examples 5 and 6. In contrast, in Example 2, the reflection layer 172 was composed of an APC-TR alloy containing Ag (silver), Pd (palladium) and Cu (cupper) (manufactured by FURUYA METAL Co., Ltd.), and the thickness thereof was 1000 Å.

On the other hand, regarding the second conductive layer 173, IZO (indium zinc oxide) was used in Examples 1, 5 and 6, ITO (indium tin oxide) was used in Example 2, ICO (indium cerium oxide) was used in Example 3 and IGO (indium gallium oxide) was used in Example 4, and the thickness of each was 500 Å. Further, in Comparative example 1, the second conductive layer 173 was composed of Ni (nickel) and the thickness thereof was 1000 Å. Still further, in Comparative examples 2 and 3, the second conductive layer 173 was composed of Pt (platinum) and the thickness thereof was 500 Å in both examples.

Further, in each of Examples 1 to 7 and Comparative examples 1 to 3, the coating layer 174 had a configuration in which plural metals are laminated. Here, in Example 1, as a first layer laminated on the second conductive layer 173, Ni (nickel) with a thickness of 100 Å, as a second layer laminated on the first layer, Pt (platinum) with a thickness of 1000 Å, and as a third layer laminated on the second layer, Au (gold) with a thickness of 3000 Å were used. Further, in Example 2, as the first layer, Ta (tantalum) with a thickness of 200 Å, as the second layer, Pt (platinum) with a thickness of 1000 Å, and as the third layer, Au (gold) with a thickness of 3000 Å were used. Moreover, in Example 3, as the first layer, Ta (tantalum) with a thickness of 200 Å, as the second layer, W (tungsten) with a thickness of 1000 Å, and as the third layer, Au (gold) with a thickness of 3000 Å were used. Still further, in Example 4, as the first layer, NiTi (nickel-titanium) with a thickness of 200 Å, as the second layer, W (tungsten) with a thickness of 1000 Å, and as the third layer, Au (gold) with a thickness of 3000 Å were used. In Example 5, as the first layer, Ti (titanium) with a thickness of 100 Å, as the second layer laminated on the first layer, Pt (platinum) with a thickness of 1000 Å, and as the third layer laminated on the second layer, Au (gold) with a thickness of 4000 Å were used. In Example 6, as the first layer, TaN (tantalum nitride) with a thickness of 100 Å, as the second layer, Pt (platinum) with a thickness of 1000 Å, and as the third layer, Au (gold) with a thickness of 5000 Å were used. In Example 7, as the first layer, Ni (nickel) with a thickness of 100 Å, as the second layer, Pt (platinum) with a thickness of 1000 Å, and as the third layer, Au (gold) with a thickness of 3000 Å were used.

On the other hand, in Comparative examples 1 to 3, as the first layer, Pt (platinum) with a thickness of 1000 Å, and as the second layer, Au (gold) with a thickness of 3000 Å were used.

Next, an evaluation method and an evaluation result of the semiconductor light emitting element 1 in each example and each comparative example will be described.

The semiconductor light emitting element 1 having an electrode structure shown by each of the examples and comparative examples (a light emitting element structure having a dominant wavelength of 460 nm) was prepared, held at room temperature (20° C.) and in an $N_2$ atmosphere for 10 minutes to have a temperature of 200° C., 300° C. and 400° C., and thereafter, measurement of the forward voltage (Vf) and measurement of light emission output of each semiconductor light emitting element 1 were performed.

First, regarding the former, a forward voltage with an applied current value of 20 mA (forward direction) was measured with respect to each semiconductor light emitting element 1 through conduction by a probe. Further, regarding the latter, the light emission output for the applied current of 20 mA (forward direction) was measured by a tester in a state where each semiconductor light emitting element 1 is mounted in a TO-18 can package. Evaluation results thereof are shown in Table 2 described above.

Initially, in Examples 1 to 7, there were observed no increase of forward voltage Vf and no reduction in light emission output Po within a temperature range from the room temperature to 400° C.

In contrast, in Comparative example 1, there were observed no increase of the forward voltage Vf and no reduction in the light emission output Po within a temperature range from the room temperature to 300° C., however, the reduction in the light emission output Po was observed at 400° C. Since Ni is used for the second conductive layer 173 in the configuration of Comparative example 1, it is considered that the cause may be deterioration of reflective performance in the reflection layer 172 upon occurrence of migration of Ag existing in the reflection layer 172 that is in contact with the second conductive layer 173. However, in Comparative example 1, there was no increase of the forward voltage Vf even at 400° C. It should be noted that no increase of the forward voltage Vf may attribute to excellent ohmic contact maintained between the first conductive layer 171 and the reflection layer 172 even in the case of heating due to IZO used as the first conductive layer 171.

Further, in Comparative example 2, there were observed no increase of the forward voltage Vf and no reduction in the light emission output Po within a temperature range from the room temperature to 200° C., however, the reduction in the light emission output Po was observed at 300° C. or more. Since Pt is used as the second conductive layer 173 in the configuration of the Comparative example 2, it is considered that occurrence of migration of Ag becomes prominent at a lower temperature compared to the case where Ni is used as Comparative example 1. However, in Comparative example 2, there was observed no increase of the forward voltage Vf even in the rage of 300° C. to 400° C. It should be noted that, similar to Comparative example 1, no increase of the forward voltage Vf may attribute to excellent ohmic contact maintained between the first conductive layer 171 and the reflection layer 172 even in the case of heating due to IZO used as the first conductive layer 171.

Further, in Comparative example 3, the reduction in the light emission output Po and increase of the forward voltage Vf were observed at 300° C. or more. Moreover, the degree of the reduction in the light emission output Po and increase of the forward voltage Vf in Comparative example 3 was prominent compared to the above-described Comparative examples 1 and 2. Here, it is considered that the reduction in the light emission output Po may be due to the fact that migration of Ag with a rise in temperature is likely to occur because Pt is used in both first conductive layer 171 and second conductive layer 173. Further, since Pt is used as the first conductive layer 171 in Comparative example 3, it is considered that increase of the forward voltage Vf may be due to the fact that an ohmic contact between the p-type semiconductor layer 160 and the first conductive layer 171 can be hardly achieved by heating.

REFERENCE SIGNS LIST

1 . . . Semiconductor light emitting element
10 . . . Wiring board
11 . . . Anode
12 . . . Cathode
20 . . . Solders
100 . . . Laminated semiconductor layer
110 . . . Substrate
120 . . . Intermediate layer
140 . . . n-type semiconductor layer
140a . . . n-contact layer
140b . . . n-cladding layer
150 . . . Light emitting layer
150a . . . Barrier layer
150b . . . Well layer
160 . . . p-type semiconductor layer
160a . . . p-cladding layer
160b . . . p-contact layer
170 . . . First electrode
171 . . . First conductive layer
172 . . . Reflection layer
173 . . . Second conductive layer
174 . . . Coating layer
180 . . . Second electrode
190 . . . Protection layer

The invention claimed is:

1. A semiconductor light emitting element comprising:
a group III nitride semiconductor layer including a light emitting layer that emits light by conduction, a n-type semiconductor layer, and a p-type semiconductor layer;
a transparent substrate that has optical permeability to the light emitted from the light emitting layer, on which the group III nitride semiconductor layer is laminated;
a first electrode that is formed on the p-type semiconductor layer;
a second electrode that is formed on a semiconductor layer exposure surface of the n-type semiconductor layer, which is exposed by cutting out a part of the laminated p-type semiconductor layer, light emitting layer and n-type semiconductor layer;
wherein the first electrode includes:
a first conductive layer that is composed of a metal oxide having optical permeability to the light emitted from the light emitting layer and conductivity, the first conductive layer being laminated on the p-type semiconductor layer of the group III nitride semiconductor layer;
a reflection layer that is composed of any one of silver and an alloy containing silver and is laminated on the first conductive layer;
a second conductive layer that is provided so as not to contact the group III nitride semiconductor layer, composed of a metal oxide having conductivity and is laminated on the reflection layer to be used for electrical connection with the outside; and
a coating layer that is composed of a metal having conductivity, and is provided to cover the first conductive layer, the reflection layer and the second conductive layer, which are laminated, with respect to the group III nitride semiconductor layer,
wherein the first conductive layer, the reflection layer, the second conductive layer and the coating layer are provided in this order.

2. The semiconductor light emitting element according to claim 1, wherein the first conductive layer contains indium oxide as the metal oxide.

3. The semiconductor light emitting element according to claim 2, wherein the first conductive layer further contains zinc oxide as the metal oxide.

4. The semiconductor light emitting element according to claim 1, wherein the transparent substrate is composed of sapphire single crystals.

5. The semiconductor light emitting element according to claim 1, wherein the second conductive layer is formed not to contact the group III nitride semiconductor layer.

6. The semiconductor light emitting element according to claim 1, wherein the reflection layer and the coating layer are arranged not to contact each other.

7. The semiconductor light emitting element according to claim 1, wherein any one of the first conductive layer, the reflection layer and the second conductive layer includes a top surface that is formed along a surface of the group III nitride semiconductor layer and an inclined surface that is inclined to the group III nitride semiconductor layer from an edge portion of the top surface.

8. A semiconductor light emitting element comprising:
a substrate;
a group III nitride semiconductor layer including a light emitting layer that emits light by conduction and is laminated on the substrate, the group III nitride semiconductor layer outputting the light emitted from the light emitting layer to the outside through the substrate;
a first conductive layer that is composed of a metal oxide having optical permeability to the light emitted from the light emitting layer and conductivity, the first conductive layer being laminated on the group III nitride semiconductor layer on a side opposite to the substrate;

a reflection layer that is composed of any one of silver and an alloy containing silver and reflects the light incident from the light emitting layer through the first conductive layer;

a second conductive layer that is composed of a metal oxide having conductivity and is laminated on the reflection layer to be used for electrical connection with the outside; and a coating layer that is composed of a metal having conductivity, and is provided to cover the first conductive layer, the reflection layer and the second conductive layer, which are laminated, with respect to the group III nitride semiconductor layer, wherein the first conductive layer, the reflection layer, the second conductive layer and the coating layer are provided in this order.

9. The semiconductor light emitting element according to claim 8, wherein the first conductive layer contains indium oxide as the metal oxide.

10. The semiconductor light emitting element according to claim 9, wherein the first conductive layer further contains zinc oxide as the metal oxide.

11. The semiconductor light emitting element according to claim 8, wherein the substrate is composed of sapphire single crystals.

12. The semiconductor light emitting element according to claim 8, wherein the second conductive layer is formed not to contact the group III nitride semiconductor layer.

13. The semiconductor light emitting element according to claim 8, wherein the reflection layer and the coating layer are arranged not to contact each other.

14. The semiconductor light emitting element according to claim 8, wherein any one of the first conductive layer, the reflection layer and the second conductive layer includes a top surface that is formed along a surface of the group III nitride semiconductor layer and an inclined surface that is inclined to the group III nitride semiconductor layer from an edge portion of the top surface.

15. A method for producing the semiconductor light emitting element as claimed in claim 1, said method comprising:

forming a group III nitride semiconductor layer including a light emitting layer on a substrate;

forming a first mask on the group III nitride semiconductor layer, the first mask having a first opening portion that extends from an inlet side thereof toward the group III nitride semiconductor layer to expose a partial region of the group III nitride semiconductor layer;

forming a first conductive layer on the group III nitride semiconductor layer through the first opening portion, the first conductive layer being composed of a metal oxide having optical permeability to light emitted from the light emitting layer and conductivity;

forming a reflection layer on the first conductive layer through the first opening portion, the reflection layer being composed of any one of silver and an alloy containing silver;

forming a second conductive layer on the reflection layer through the first opening portion, the second conductive layer being composed of a metal oxide having conductivity;

removing the first mask from the group III nitride semiconductor layer;

forming a second mask on the group III nitride semiconductor layer, the second mask having a second opening portion that extends from an inlet side thereof toward the group III nitride semiconductor layer to expose the second conductive layer and the group III nitride semiconductor layer positioned on an edge of the second conductive layer;

forming a coating layer on the second conductive layer and the group III nitride semiconductor layer through the second opening portion, the coating layer being composed of a metal having conductivity; and removing the second mask.

16. The method for producing a semiconductor light emitting element according to claim 15, wherein a diameter of the second opening portion of the second mask on the inlet side thereof is set larger than a diameter of the first opening portion of the first mask on the inlet side thereof.

17. The semiconductor light emitting element according to claim 1, wherein the first conductive layer is laminated directly on the group III nitride semiconductor layer, the reflecting layer is laminated directly on the first conductive layer, and the second conductive layer is laminated directly on the reflecting layer, in this order.

18. The semiconductor light emitting element according to claim 1, wherein the first conductive layer is crystalline and the second conductive layer is amorphous.

19. The semiconductor light emitting element according to claim 1, wherein the coating layer comprises a Ni (nickel) layer as a first layer formed in contact with the second conductive layer, a Pt (platinum) layer as a second layer formed on the outside of the Ni layer, and an Au (gold) layer as a third layer formed on the outside of the Pt layer, namely, on the outermost side.

* * * * *